: (12) United States Patent
Yasumatsu

(10) Patent No.: US 7,700,995 B2
(45) Date of Patent: Apr. 20, 2010

(54) SEMICONDUCTOR DEVICE AND DISPLAY DEVICE

(75) Inventor: Takuto Yasumatsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 140 days.

(21) Appl. No.: 12/093,791

(22) PCT Filed: Sep. 6, 2006

(86) PCT No.: PCT/JP2006/317641

§ 371 (c)(1),
(2), (4) Date: May 15, 2008

(87) PCT Pub. No.: WO2007/080672

PCT Pub. Date: Jul. 19, 2007

(65) Prior Publication Data

US 2009/0159894 A1 Jun. 25, 2009

(30) Foreign Application Priority Data

Jan. 12, 2006 (JP) ............................. 2006-005402

(51) Int. Cl.
*H01L 21/8228* (2006.01)
*H01L 29/768* (2006.01)
(52) U.S. Cl. ...................................... 257/324; 438/216
(58) Field of Classification Search .................. 438/216, 438/287, 591, 786; 257/324, 411
See application file for complete search history.

(56) References Cited

U.S. PATENT DOCUMENTS

| 5,328,861 | A | | 7/1994 | Miyakawa |
| 5,396,084 | A | | 3/1995 | Matsumoto |
| 5,455,182 | A | * | 10/1995 | Nishimoto et al. .......... 438/165 |
| 5,614,731 | A | * | 3/1997 | Uchikoga et al. ............. 257/59 |

(Continued)

FOREIGN PATENT DOCUMENTS

JP 05-152569 6/1993

(Continued)

OTHER PUBLICATIONS

International Search Report for PCT/JP2006/317641 dated Dec. 12, 2006.

*Primary Examiner*—Calvin Lee
(74) *Attorney, Agent, or Firm*—Nixon & Vanderhye, P.C.

(57) ABSTRACT

To provide a semiconductor device and a display device which include a circuit element capable of improving performances and a circuit element capable of increasing a withstand voltage on the same substrate and which can improve the reliability. The semiconductor device of the present invention includes a first circuit element and a second circuit element on a substrate, the first circuit element having a structure in which a first semiconductor layer, a first insulating film, a first conductive layer, and a third insulating film are stacked in this order, the second circuit element having a structure in which a second semiconductor layer, a second insulating film having a thickness larger than a thickness of the first insulating film, and a second conductive layer are stacked in this order, wherein the first insulating film has a multilayer structure including a silicon nitride layer as the uppermost layer, the second insulating film has a lower part and an upper part, the lower part includes the multilayer structure of the first insulating film, and the upper part includes a structure of the third insulating film formed on the first conductive layer.

45 Claims, 16 Drawing Sheets

U.S. PATENT DOCUMENTS

| | | | |
|---|---|---|---|
| 6,005,270 A * | 12/1999 | Noguchi | 257/315 |
| 2003/0025127 A1 | 2/2003 | Yanai et al. | |
| 2004/0206956 A1 | 10/2004 | Yanai et al. | |
| 2006/0081946 A1 | 4/2006 | Yanai et al. | |

FOREIGN PATENT DOCUMENTS

| | | |
|---|---|---|
| JP | 05-335573 | 12/1993 |
| JP | 07-130668 | 5/1995 |
| JP | 11-168215 | 6/1999 |
| JP | 11-281943 | 10/1999 |
| JP | 2003-045892 | 2/2003 |
| JP | 2005-012003 | 1/2005 |
| JP | 2005-072461 | 3/2005 |
| JP | 2005-260168 | 9/2005 |

* cited by examiner

Fig.1
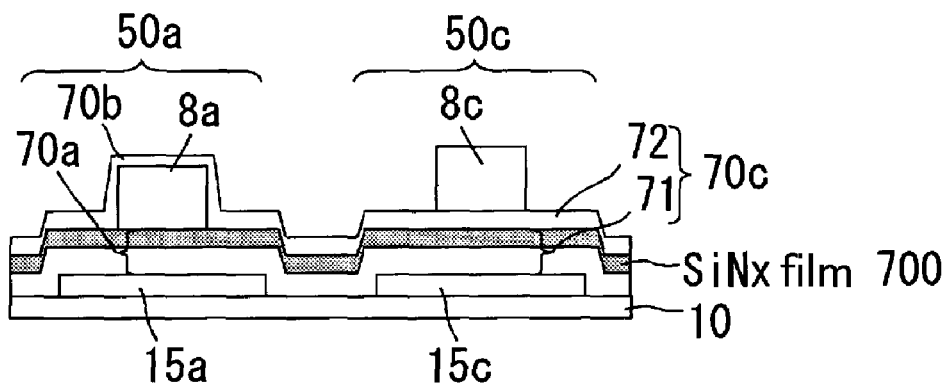
Fig.2
(a)
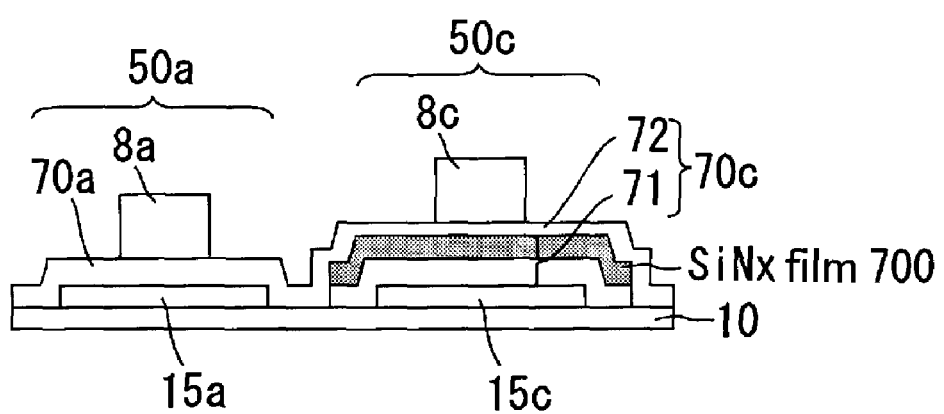
(b)
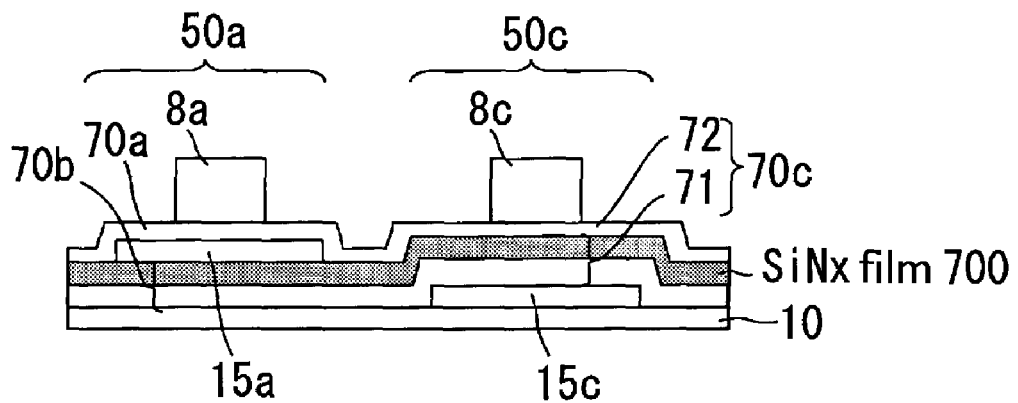

Fig.3
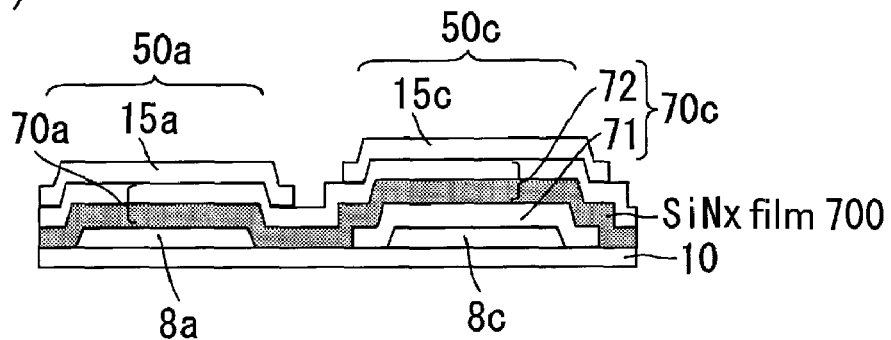
(a)
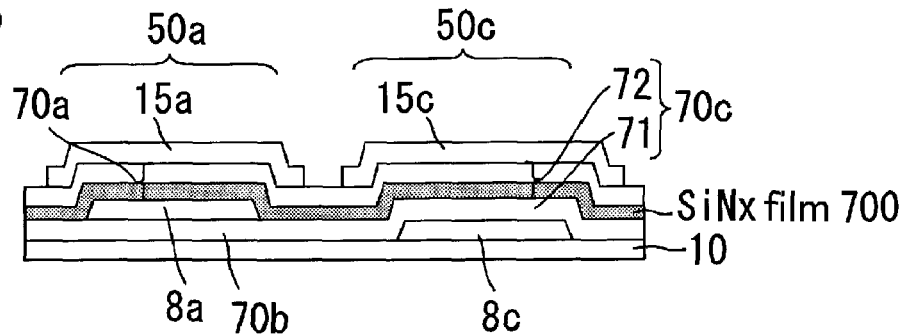
(b)
Fig.4
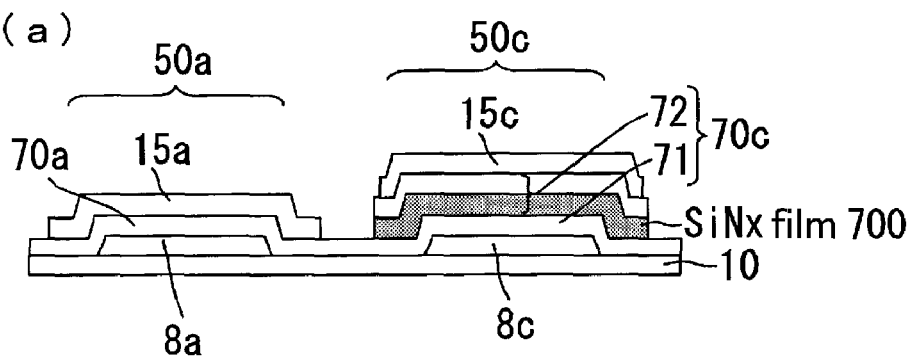
(a)
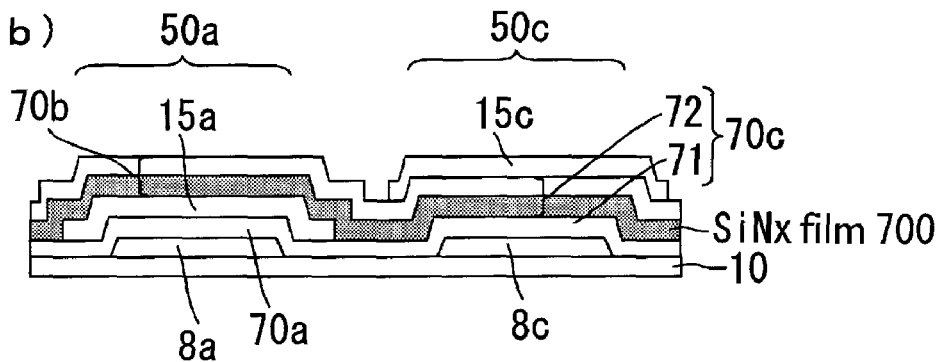
(b)

Fig.5
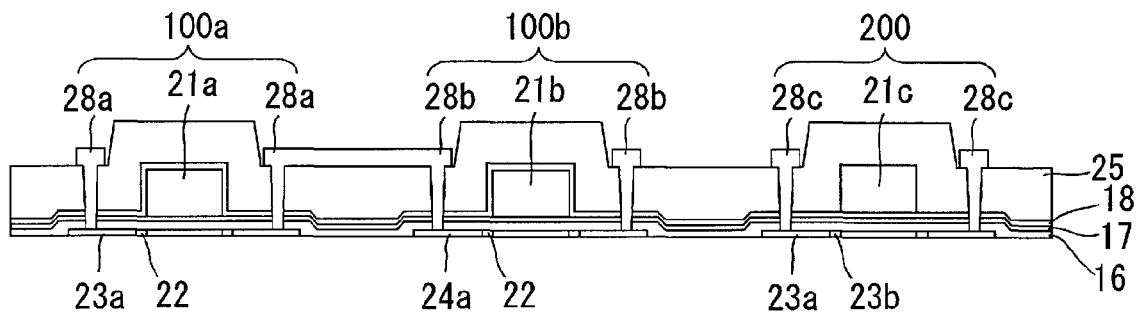
Fig.6-1
(a)
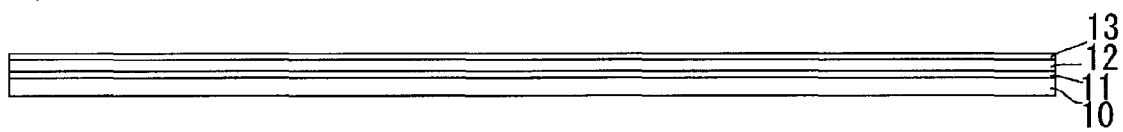
(b)
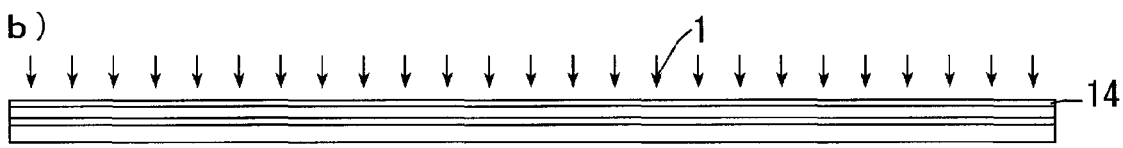
(c)
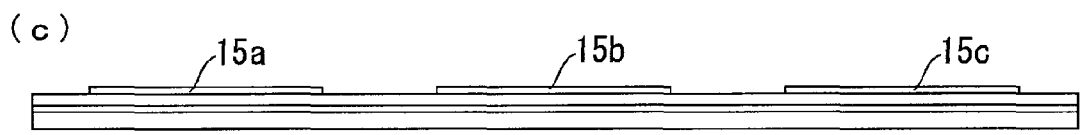
(d)
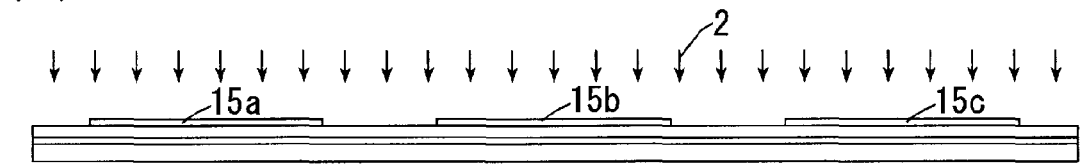
(e)
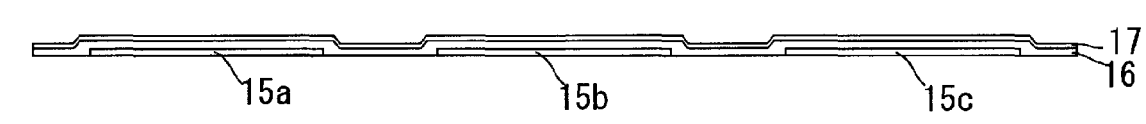
(f)
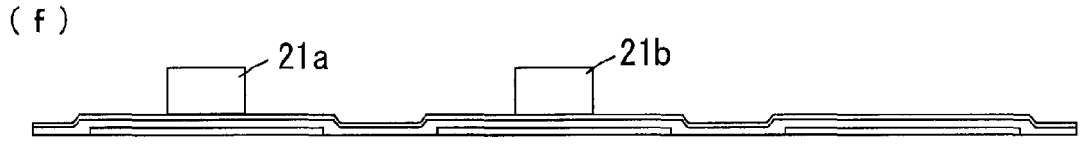

Fig.16
(a)
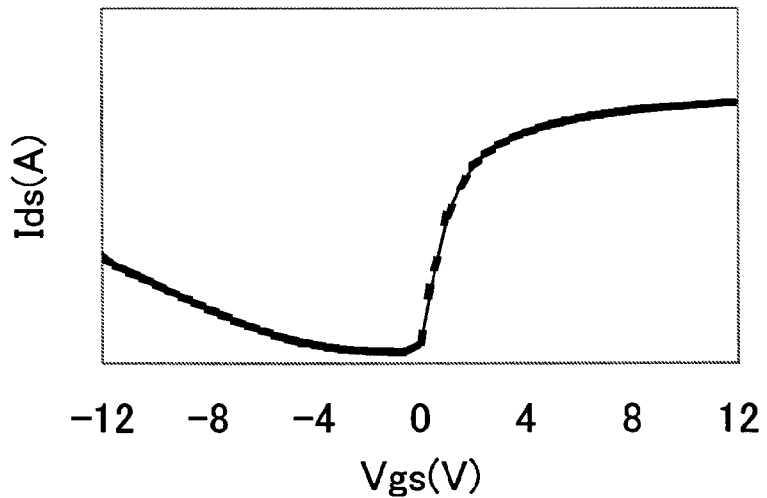
(b)
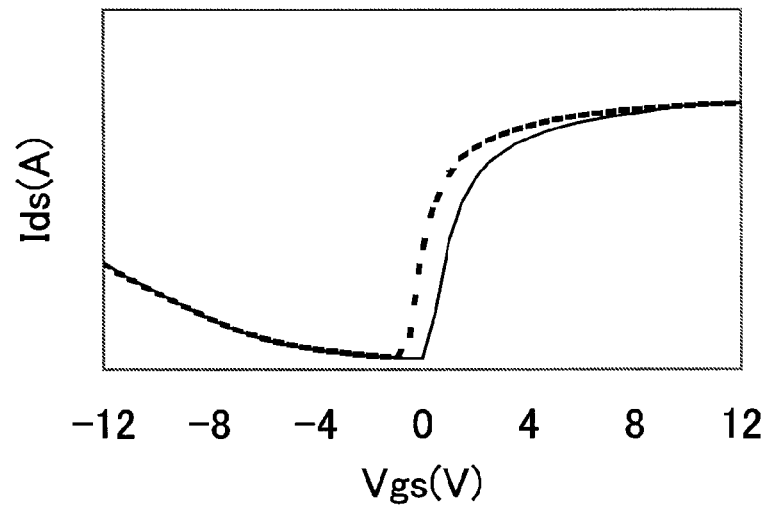

Fig.17
(a)
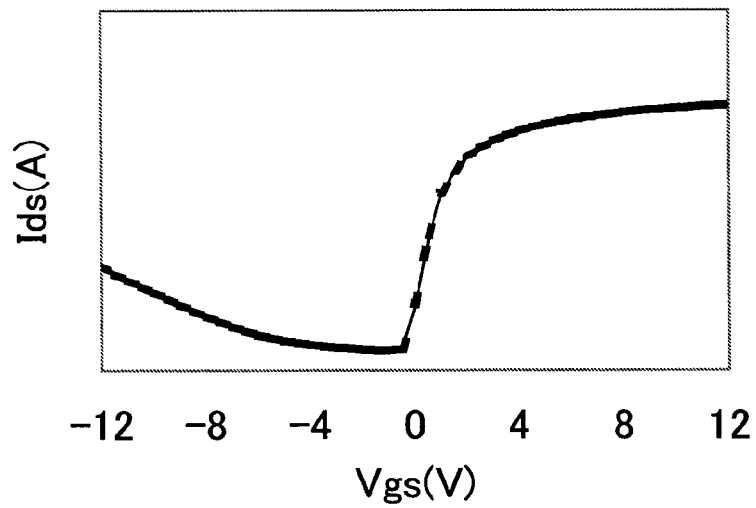
(b)
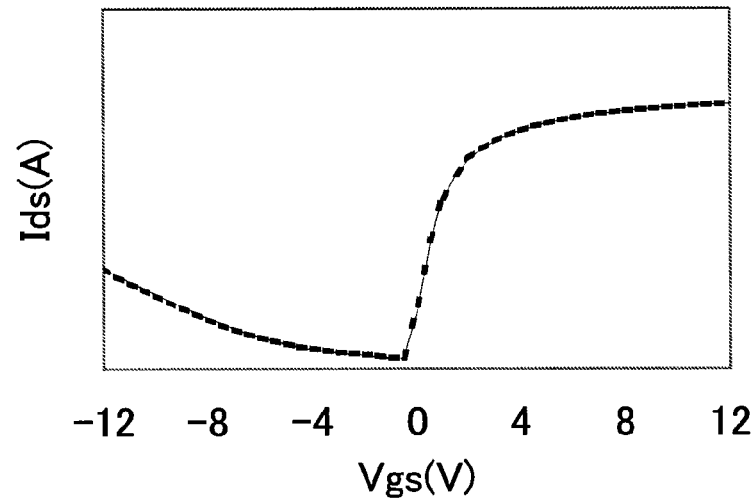

SEMICONDUCTOR DEVICE AND DISPLAY DEVICE

This application is the U.S. national phase of International Application No. PCT/JP2006/317641 filed Sep. 6, 2006 which designated the U.S. and claims priority to Japanese Application No. 2006-005402 filed Jan. 12, 2006, the entire contents of each of which are hereby incorporated by reference.

TECHNICAL FIELD

The present invention relates to a semiconductor device, a production method thereof, and a display device. More specifically, the present invention relates to a semiconductor device such as an active matrix substrate, a production method thereof, and a display device.

BACKGROUND ART

A semiconductor device is an active element-including electronic device using electrical characteristics of a semiconductor. Such a semiconductor device has been widely used in an audio device, a communication device, a computer, an electric appliance and the like. Among these, a TFT array substrate has been known as a semiconductor device including a thin film transistor (hereinafter, also referred to as a "TFT") on a substrate. Such a TFT array substrate has been used as a component of an active matrix driving liquid crystal display device and the like.

A system-on-glass technology in which a pixel circuit part and a driving circuit part are formed on the same substrate using polysilicon (hereinafter, also referred to as "p-Si") as a semiconductor material for a TFT has been recently used in the active matrix driving liquid crystal display device. Due to this technology, a TFT in the pixel circuit part (hereinafter, also referred to as a "pixel switching TFT") and a TFT in the driving circuit part (hereinafter, also referred to as a "driving circuit TFT) are integrally formed, which permits downsizing, a reduction in electric power consumption, and high reliability of the liquid crystal display device. However, different characteristics are needed between the pixel switching TFT and the driving circuit TFT. That is, for the pixel switching TFT, a low off-state current is needed to suppress a reduction in contrast ratio or uneven image qualities inside a panel, but for the driving circuit TFT, a reduction in threshold voltage (Vth), a reduction in variation of Vth, and a high on-state current are needed in order for the driving circuit to operate at a high speed. Accordingly, in order to satisfy these needed characteristics, the pixel switching TFT and the driving circuit TFT need to have different structures.

For such a need, a method of forming a gate insulating film of the pixel switching TFT to have a thickness larger than that of a gate insulating film of the driving circuit TFT has been known, for example. For example, a thin film semiconductor device in which a TFT in a matrix circuit part, including a gate insulating film having a two-layer structure between a semiconductor layer and a gate electrode (a pixel switching TFT) and a TFT in a peripheral circuit part, including a gate insulating film having a single-layer structure (a driving circuit TFT) are formed on the same substrate is disclosed (for example, refer to Patent Document 1). In this thin film semiconductor device, the gate insulating film of the TFT in the peripheral circuit part has a silicon oxide or silicon nitride single-layer structure. The gate insulating film of the TFT in the matrix circuit part includes a lower part having the same structure as in the gate insulating film of the TFT in the peripheral circuit part. Also, the gate insulating film of the TFT in the matrix circuit part includes an upper part having a silicon oxide or silicon nitride single-layer structure. However, according to this configuration, in the TFT in the matrix circuit part, it is impossible to continuously form the two layers, i.e., the upper part and the lower part of the gate insulating film, and on the interface between the upper part and the lower part, many traps exist. Therefore, if the lower part of the gate insulating film has a silicon oxide single-layer structure, the reliability of the TFT in the matrix circuit part is reduced. In such a point, this thin film semiconductor device has room for improvement. Further, the upper part of the gate insulating film is formed by a sputtering method or a plasma CVD method. Therefore, if the lower part of the gate insulating film has a silicon oxide single-layer structure, the lower part is plasma-damaged in the step of forming the upper part of the insulating film, which further reduces the reliability of the TFT in the matrix circuit part. In such a point, this thin film semiconductor device has room for improvement. In addition, if, in the TFT in the matrix circuit part, the lower part of the gate insulating film is a silicon nitride layer, it is impossible to form an excellent interface between the gate insulating film and the semiconductor layer (polysilicon layer), which fails to obtain excellent TFT characteristics. In such a point, this thin film semiconductor device has room for improvement.

Further, a production method of a semiconductor device, in which the first and second field-effect transistors including gate insulating films with different thicknesses are formed by forming an insulating film constituting a gate insulating film, and then selectively removing a specific region of the insulating film by etching, is disclosed (for example, refer to Patent Document 2). However, according to this production method, the insulating film to be etched has a single-layer structure. Therefore, if the above-mentioned etching is dry etching, the part formed after the etching is plasma-damaged, which might possibly reduce the reliability. In such a point, the method has room for improvement.

Accordingly, in the conventional production method, if the pixel switching TFT and the driving circuit TFT are formed on the same substrate, in either one TFT, the gate insulating film is deteriorated or damaged, and thereby the reliability is reduced. Therefore, mass production of such a semiconductor device has not been achieved yet.

[Patent Document 1]
Japanese Kokai Publication No. Hei-05-335573
[Patent Document 2]
Japanese Kokai Publication No. 2005-72461

DISCLOSURE OF INVENTION

The present invention has been made in view of the above-mentioned state of the art. The present invention has an object to provide a semiconductor device and a display device which include a circuit element capable of improving performances and a circuit element capable of increasing a withstand voltage on the same substrate and which can improve the reliability.

The present inventor made various investigations on a method for producing a semiconductor device including the first thin film transistor (the first circuit element) and the second thin film transistor (the second circuit element), the first thin film transistor having a structure in which the first semiconductor layer, the first gate insulating film (the first insulating film), the first gate electrode (the first conductive layer), and the third insulating film are stacked in this order, the second thin film transistor having a structure in which the second semiconductor layer, the second gate insulating film having a thickness larger than that of the first gate insulating film, and the second gate electrode (the second conductive layer) are stacked in this order. The inventor noted a method for forming the above-mentioned first and second gate insulating films.

Further, the inventor made various investigations on a method, as shown in FIGS. 18(a) to 18(d), including the steps of: forming the first gate insulating film 4a including silicon oxide ($SiO_2$) and a lower part 4c of the second gate insulating film 9 on the first semiconductor layer 15a and the second semiconductor layer 15c (FIG. 18(a)); forming the first gate electrode 5 (FIG. 18(b)); forming the third insulating film 6a including silicon nitride ($SiN_x$) and the like (part of the third insulating film, that is, any of the lower, middle, and upper parts of the third insulating film) and an upper part 6c of the second gate insulating film 9 (FIG. 18(c)); and forming the second gate electrode 8 (FIG. 18(d)) in this order. According to this method, the first insulating film 4a and the lower part 4c of the second gate insulating film 9 can be formed in the same step, and the third insulating film 6a and the lower part 6c of the second gate insulating film 9 can be formed in the same step. Therefore, as shown in FIG. 18(d), the first gate insulating film 4a including a $SiO_2$ single layer and the second gate insulating film 9 having a two-layer structure in which the lower part 4c including $SiO_2$ and the upper part 6c including $SiN_x$ and the like are formed can be simply formed.

However, the inventor found that according to this method, the following problems are caused. In the step shown in FIG. 18(b), the first gate electrode 5 is normally formed by dry-etching a metal film and the like in order to be finely formed. Accordingly, in this step, the first gate insulating film 4a including $SiO_2$ which is easily plasma-damaged and the lower part 4c of the second gate insulating film 9 is exposed to plasma to be damaged. Therefore, the reliability of the first TFT 50a and the second TFT 50c are reduced. In addition, the inventor found the following. In the step shown in FIG. 18(c), the third insulating film 6a including $SiN_x$ and the upper part 6c of the second gate insulating film 9 are generally formed by a plasma chemical vapor deposition (CVD) method in view of uniform film thickness and step coverage. Accordingly, also in this step, the lower part 4c of the second gate insulating film 9 is plasma-damaged, and thereby the reliability might be reduced.

Further, the inventor found the following. As shown in FIGS. 18(a) to 18(c), the first gate insulating film 4a and the third insulating film 6a in the first TFT 50a are formed in different steps. The lower part 4c and the upper part 6c of the second gate insulating film 9 in the second TFT 50c are formed in different steps. Accordingly, on the interface between the first gate insulating film 4a and the third insulating film 6a and the interface between the lower part 4c and the upper part 6c of the second gate insulating film 9, mobile ions (impurities) such as boron (B), sodium (Na), phosphorus (P), and a heavy metal adhere. These impurities are diffused into and the first semiconductor layer 15a and the second semiconductor layer 15c as well as the first gate insulating film 4a and the lower part 4c of the second gate insulating film 9. Therefore, the reliability of the first TFT 50a and the second TFT 50c is further reduced.

Then, the inventor noted the structures of the first gate insulating film 4a and the lower part 4c of the second gate insulating film 9. The inventor found that $SiN_x$ has a high resistance to plasma, and then the inventor made investigations on a method shown in FIGS. 19(a) to 19(c). As shown in FIG. 19(a), if the first gate insulating film 4a and the lower part 4c of the second gate insulating film 9 are formed to have a multilayer structure in which the uppermost layer is a $SiN_x$ layer, the first gate insulating film 4a and the lower part 4c of the second gate insulating film 9 can be protected from the plasma damage in the steps shown in FIGS. 19(b) and 19(c).

Further, the inventor found the following. $SiN_x$ also has an impurity diffusion-preventing (barrier) function. Therefore, the impurities adhering to the first gate insulating film 4a and the lower part 4c of the second gate insulating film 9 are trapped on the film surface. As a result, in the next annealing step and the like, the impurities can be suppressed from diffusing into the first semiconductor layer 15a and the second semiconductor layer 15c as well as the first gate insulating film 4a and the lower part 4c of the second gate insulating film 9. Therefore, a reduction in the reliability of the first TFT 50a and the second TFT 50c can suppressed. Further, the inventor also found the following. If the first gate insulating film 4a and the lower part 4c of the second gate insulating film 9 are formed to have a multilayer structure, a material for forming an excellent interface with the first semiconductor layer 15a and the second semiconductor layer 15c (for example, $SiO_2$) other than $SiN_x$ can be selected as the material for the lowest layer 7a of the first gate insulating film 4a and the lowest layer 7c in the lower part 4c of the second gate insulating film 9. Therefore, the first TFT 50a and the second TFT 50c can secure excellent characteristics.

As mentioned above, the inventor found that the reliability of the first TFT 50a and the second TFT 50c is secured, and simultaneously an improvement in performances of the first TFT 50a and an increase in withstand voltage of the second TFT 50c are permitted, and as a result, mass production of a semiconductor device including these TFTs on the same substrate is permitted. The inventor also found that the present invention can be applied to any semiconductor devices including, in addition to a TFT having a top-gate structure, two or more of the followings: TFTs having a bottom-gate structure, TFTs having a dual-gate structure, and circuit elements such as a storage capacitor element, on a substrate. As a result, the above-mentioned problems had been admirably solved, leading to completion of the present invention.

That is, the present invention is a semiconductor device including a first circuit element and a second circuit element on a substrate, the first circuit element having a structure in which a first semiconductor layer, a first insulating film, a first conductive layer, and a third insulating film are stacked in this order, the second circuit element having a structure in which a second semiconductor layer, a second insulating film having a thickness larger than a thickness of the first insulating film, and a second conductive layer are stacked in this order, wherein the first insulating film has a multilayer structure including a silicon nitride layer as the uppermost layer, the second insulating film has a lower part and an upper part, the lower part includes the multilayer structure of the first insulating film, and the upper part includes a structure of the third insulating film formed on the first conductive layer (hereinafter, also referred to as a "first semiconductor device") (for example, refer to FIG. 1).

The present invention is also a semiconductor device including a first circuit element and a second circuit element on a substrate, the first circuit element having a structure in which a first semiconductor layer, a first insulating film, and a first conductive layer are stacked in this order, and the second circuit element having a structure in which a second semiconductor layer, a second insulating film having a thickness larger than a thickness of the first insulating film, and a second conductive layer are stacked in this order, wherein the second insulating film has a lower part and an upper part, the lower part includes a silicon nitride layer as the uppermost layer, and the upper part includes a structure of the first insulating film (hereinafter, also referred to as a "second semiconductor device") (for example, refer to FIG. 2(a)).

The present invention is a semiconductor device including a first circuit element and a second circuit element on a substrate, the first circuit element having a structure in which a first conductive layer, a first insulating film, and a first semiconductor layer are stacked in this order, the second circuit element having a structure in which a second conductive layer, a second insulating film having a thickness larger than a thickness of the first insulating film, and a second semiconductor layer are stacked in this order, wherein the first insulating film has a structure in which the lowest layer is a silicon nitride layer, the second insulating film has a lower part and an upper part, and the upper part has the structure of the first insulating film (hereinafter, also referred to as a "third semiconductor device") (for example, refer to FIG. 3(a)).

The present invention is also a semiconductor device including a first circuit element and a second circuit element on a substrate, the first circuit element having a structure in which a first conductive layer, a first insulating film, and a first semiconductor layer are stacked in this order, the second circuit element having a structure in which a second conductive layer, a second insulating film having a thickness larger than a thickness of the first insulating film, and a second semiconductor layer are stacked in this order, wherein the second insulating film includes a lower part and an upper part, the lower part has a structure of the first insulating film, and the upper part includes a silicon nitride layer as the lowest layer (hereinafter, also referred to as a "fourth semiconductor device") (for example, refer to FIG. 4(a)).

The first semiconductor device of the present invention is mentioned in more detail below.

The first semiconductor device of the present invention includes the first circuit element and the second circuit element on the substrate. The first circuit element has a structure in which the first semiconductor layer, the first insulating film, the first conductive layer, and the third insulating film are stacked in this order. The second circuit element has a structure in which the second semiconductor layer, the second insulating film having a thickness larger than that of the first insulating film, and the second conductive layer are stacked in this order. As preferable embodiments of the above-mentioned first semiconductor device, for example, an embodiment (1) in which the first circuit element and the second circuit element are thin film transistors (TFTs), and an embodiment (2) in which the first circuit element is a TFT and the second circuit element is a storage capacitor element may be mentioned. According to the embodiment (1), when the first circuit element is the first TFT and the second circuit element is the second TFT, a gate insulating film (the first insulating film) of the first TFT has a thickness smaller than that of a gate insulating film (the second insulating film) of the second TFT. Therefore, the first circuit element can function as a high-performance TFT capable of operating at a higher speed in comparison to the second circuit element. The second circuit element can function as a TFT having a withstand voltage larger than that of the first circuit element. According to the embodiment (2), when the first circuit element is the third TFT and the second circuit element is a storage capacitor element, the first insulating film (the gate insulating film of the third TFT) has a thickness smaller than that of the second insulating film (the insulating film of the storage capacitor element). Therefore, the first circuit element can function as a high-performance TFT capable of operating at a high speed. The second circuit element can function as a storage capacitor element having a large withstand voltage.

A TFT having a top-gate structure, a TFT having a dual-gate structure, and the like may be mentioned as the TFTs in the above-mentioned first semiconductor device. In order to finely form the TFTs, the TFTs preferably have a top-gate structure.

The above-mentioned first insulating film has a multilayer structure in which the uppermost layer is a silicon nitride ($SiN_x$) layer (for example, refer to FIG. 1). $SiN_x$ has a high resistance to plasma. Therefore, if the first insulating film has a $SiN_x$ layer as the uppermost layer, the first conductive layer can be formed by dry etching such as plasma etching (plasma ashing) without plasma-damaging the first insulating film. That is, the reliability of the first insulating film is maintained, and simultaneously not only the first conductive layer but also the first circuit element can be finely formed. Further, $SiN_x$ has a function of preventing diffusion of impurities, and therefore mobile ions (impurities) such as boron (B), sodium (Na), phosphorus (P), and a heavy metal adhering to the $SiN_x$ layer of the first insulating film are trapped and remain on the surface of the $SiN_x$ layer. As a result, the impurities can be suppressed from diffusing into not only the first insulating film but also the first semiconductor layer. Accordingly, a reduction in reliability, caused by shifting of the characteristics of the first circuit element (TFT and the like), can be suppressed. Further, the material for the lowest layer of the above-mentioned first insulating film can be selected independently from the material ($SiN_x$) for the uppermost layer because the above-mentioned first insulating film has a multi layer structure. That is, as the material for the lowest layer of the above-mentioned first insulating film, a material which forms an excellent interface with the first semiconductor layer (for example, $SiO_2$) is selected, thereby securing excellent drain voltage ($I_d$)-gate voltage ($V_g$) characteristics (transfer characteristics) and the like in the first circuit element. Further, the above-mentioned first insulating film includes the $SiN_x$ layer as the uppermost layer. Therefore, if an interlayer insulating film ($SiN_x$ film) is formed on the first conductive layer, damage like plasma damage, caused by stress of the interlayer insulating film, can be reduced. Further, the above-mentioned first insulating film includes a $SiN_x$ layer with a high dielectric constant. Therefore, the Equivalent Oxide Thickness (EOT) can be reduced, and the performances of the first circuit element can be further improved.

The above-mentioned second insulating film includes the lower part having the multilayer structure of the first insulating film and the upper part having a structure of the third insulating film formed on the first conductive layer (for example, refer to FIG. 1). The lower part of the above-mentioned second insulating film has the same structure as the multilayer structure of the first insulating film, with regard to the number and the order of the stacked layers. That is, the lower part of the second insulating film has a multilayer structure in which the uppermost layer is a $SiN_x$ layer. Therefore, the first conductive layer can be formed by dry etching such as plasma etching without plasma-damaging the lower part of the second insulating film. Further, the upper part of the second insulating film can be formed by a plasma CVD method and the like. Accordingly, the reliability of the second insulating film is maintained, and simultaneously not only the first conductive layer but also the first circuit element can be finely formed. In addition, if the lower part of the above-mentioned second insulating film has a multilayer structure, the material for the lowest layer of the above-mentioned second insulating film can be selected independently from the material ($SiN_x$) for the uppermost layer in the lower part. That is, a material for forming an excellent interface with the second semiconductor layer (for example, $SiO_2$) is selected as the material for the lowest layer of the above-mentioned second insulating film, thereby securing excellent transfer characteristics and the like in the second circuit element. Further, the lower part and the upper part of the above-mentioned second insulating film are formed in different steps. $SiN_x$ constituting the uppermost layer in the lower part has a function of preventing diffusion of impurities. Therefore, mobile ions (impurities) adhering to the lower part of the second insulating film are trapped and remain on the $SiN_x$ layer surface. As a result, the impurities can be suppressed from diffusing into not only the lower part of the second insulating film but also the second semiconductor layer. Accordingly, a reduction in reliability, caused by shifting of the characteristics of the second TFT, can be suppressed. Further, the physical thickness of the second insulating film can be increased because the lower part of the second insulating film has a $SiN_x$ layer having a high dielectric constant. Therefore, the withstand voltage of the second circuit element can be further increased. Further, the upper part of the above-mentioned second insulating film includes a structure of the third insulating film formed on the first conductive layer. Therefore, the patterning steps and the like performed when the upper part of the above-mentioned second insulating film is formed can be reduced. As a result, the production steps can be simplified.

Accordingly, the first semiconductor device of the present invention permits mass production of a semiconductor device which includes the circuit element capable of improving the performances and the circuit element capable of increasing a withstand voltage on the same substrate and which sufficiently secures the reliability.

Each of the above-mentioned first insulating film and the lower part of the second insulating film may have a structure including three or more layers as long as each has a multilayer structure, that is, a structure including two or more layers. The material for layers other than the $SiN_x$ layer of the first insulating film and the second insulating film is not especially limited. The following materials may be mentioned. Silicon oxide ($SiO_2$); SiOF, SiOC, and the like, which are materials having a dielectric constant lower than that of $SiO_2$; and titanium dioxide ($TiO_2$), dialuminum trioxide ($Al_2O_3$), tantalum oxide such as ditantalum pentaoxide ($Ta_2O_5$), hafnium dioxide ($HfO_2$), and zirconium dioxide ($ZrO_2$), which are materials having a dielectric constant higher than that of $SiO_2$. The above-mentioned first insulating film and the lower part of the second insulating film may include a (integrated) layer formed in the same step. It is preferable that all of the layers constituting the first insulating film and the layers constituting the lower part of the second insulating film are formed in the same steps, respectively.

In addition, the above-mentioned third insulating film and the upper part of the second insulating film may have a single-layer structure or a multilayer structure. Accordingly, the uppermost layer and the lowest layer mean the same layer in the single-layer structure, in addition to the case where the uppermost layer and the lowest layer mean the respective layers in the multilayer structure. Examples of the configuration of the upper part of the second insulating film include a configuration (1) in which the upper part of the second insulating film has a structure of the middle part of the third insulating film, a configuration (2) in which it has a structure of the lower part of the third insulating film, a configuration (3) in which it has a structure of the upper part of the third insulating film, and a configuration (4) in which it has the entire structure of the third insulating film. The configurations (2) and (3) are preferable and the configuration (4) is particularly preferable in order to reduce the patterning steps and the like performed when the third insulating film is formed. The middle part in the configuration (1) is not especially limited as long as at least the uppermost layer and the lowest layer are not included. The middle part may be composed of one layer or two or more layers. The lower part in the configuration (2) is not especially limited as long as at least the lowest layer of the third insulating film is included. The lower part may be composed of one layer or two or more layers. The upper part in the configuration (3) is not especially limited as long as at least the uppermost layer of the third insulating film is included. The upper part may be composed of one layer or two or more layers.

The following materials may be mentioned as the material for the above-mentioned third insulating film. Silicon oxide ($SiO_2$); SiOF, SiOC, and the like, which are materials having a dielectric constant lower than that of $SiO_2$; silicon nitride ($SiN_x$), titanium dioxide ($TiO_2$), dialuminum trioxide ($Al_2O_3$), and tantalum oxide such as ditantalum pentaoxide ($Ta_2O_5$), hafnium dioxide ($HfO_2$), and zirconium dioxide ($ZrO_2$), which are materials having a dielectric constant higher than that of $SiO_2$.

The above-mentioned silicon nitride ($SiN_x$) is not especially limited, and trisilicon tetranitride ($Si_3N_4$) and the like is preferably used. The $SiN_x$ layer formed by a plasma chemical vapor deposition method (CVD method) is preferable because it has a high resistance to plasma and an impurity diffusion-preventing function regardless of the value of x. In addition, even if the $SiN_x$ layer which constitutes the uppermost layer of the first insulating film and the uppermost layer in the lower part of the second insulating film has a thickness of 10 nm, the operation and effects of the present invention can be obtained. Silicon oxynitride (SiNO) also has a high resistance to plasma, and therefore it can be preferably used as an alternative for $SiN_x$. However, $SiN_x$ is more preferable because of the higher resistance to plasma.

The first semiconductor device of the present invention is not especially limited as long as it includes the above-mentioned first and second circuit elements on the substrate as components. The first semiconductor device may or may not include other components.

Silicon (Si) is preferable as the material for the above-mentioned first and second semiconductor layers in view of a reduction in costs and mass production. Among these, polysilicon (p-Si) and continuous grain (CG) silicon and the like are more preferable in order to increase a mobility. The first semiconductor layer and the second semiconductor layer may be formed from different materials. However, it is preferable that they are formed from the same material in order to simplify the production steps. It is preferable that the above-mentioned first and second semiconductor layers are formed by a low-temperature process in order to suppress the glass substrate from shrinking. It is preferable that each of the above-mentioned first and second semiconductor layers have an island shape. Examples of the above-mentioned island shape include a rectangular parallelepiped shape, a truncated pyramid shape such as a truncated quadrangular pyramid, a truncated inverted pyramid shape, a truncated circular cone shape, and a truncated elliptical cone shape.

It is preferable that each of the above-mentioned first and second conductive layers includes a metal in order to suppress phonon vibration inside the first and second insulating films. For example, a multilayer structure of a compound including aluminum (Al), tantalum (Ta), tungsten (W), molybdenum (Mo), and the like, or a metal thereof can be used. The above-mentioned first and second conductive layers may be formed from the same material or different materials. Each of the above-mentioned first and second conductive layers may have a single-layer structure or a multilayer structure.

As the above-mentioned substrate, a substrate with an insulating property (insulating substrate) is preferable. For example, a glass substrate and a plastic substrate may be mentioned.

Preferable embodiments of the first semiconductor device in the present invention are mentioned in more detail below.

It is preferable that the upper part of the second insulating film includes a silicon nitride layer or a silicon oxide layer as the lowest layer. According to this, impurities adhering to the $SiN_x$ layer that is the uppermost layer in the lower part of the above-mentioned second insulating film can be trapped on the interface between the $SiN_x$ layer and the $SiN_x$ layer or the $SiO_2$ layer that is the lowest layer in the upper part of the second insulating film. Accordingly, the reliability of the second circuit element can be improved. Therefore, the reliability of the first semiconductor device of the present invention can be more sufficiently secured. It is preferable that the third insulating film includes a silicon nitride layer or a silicon oxide layer as the lowest layer. According to this, the impurities adhering to the $SiN_x$ layer that is the uppermost layer of the above-mentioned first insulating film can be trapped on the interface between the $SiN_x$ layer and the $SiN_x$ layer or $SiO_2$ layer that is the lowest layer of the third insulating film (in the part where the third insulating film is formed on the first insulating film, a part where the third insulating film is formed on the first insulating film with the first conductive layer therebetween is excluded). Accordingly, the reliability of the first circuit element can be improved. Therefore, the reliability of the first semiconductor device of the present invention can be more sufficiently secured.

It is more preferable that the upper part of the second insulating film includes a silicon nitride layer as the lowest layer. It is more preferable that the third insulating film includes a silicon nitride layer as the lowest layer. According to these, the films constituting the interface to which the impurities adhere are formed from the same material, and therefore, the matching property of the interface is excellent, which makes it difficult to generate charges.

It is preferable that the $SiN_x$ layer that is the uppermost layer of the above-mentioned first insulating film and the $SiN_x$ layer that is the lowest layer of the third insulating film are formed by the same method in order to more effectively obtain the operation and effects of the present invention. It is also preferable that the $SiN_x$ layer that is the lowest layer in the upper part of the above-mentioned second insulating film and the $SiN_x$ layer that is the uppermost layer in the lower part are formed by the same method in order to more effectively obtain the operation and effects of the present invention.

It is preferable that the first insulating film and the second insulating film include a silicon oxide layer as the lowest layer. The $SiO_2$ layer can form an excellent interface with the semiconductor layer including silicon (Si) and the like. Therefore, the characteristics of the first and second circuit elements can be more improved.

It is preferable that the first insulating film and the lower part of the second insulating film have a structure in which a silicon oxide layer and a silicon nitride layer are stacked in this order, and the upper part of the second insulating film is a silicon nitride layer or a silicon oxide layer. The above-mentioned first insulating film and the lower part of the second insulating film have a structure in which a $SiO_2$ layer and a $SiN_x$ layer are stacked in this order. Therefore, in the first insulating film, the impurities are trapped on the $SiN_x$ layer. In the second insulating film, the impurities are trapped on the interface between the $SiN_x$ layers or on the interface between the $SiN_x$ layer and the $SiO_2$ layer. Therefore, the reliability of the first and second circuit elements can be further secured. According to this, in both of the first insulating film and the second insulating film, the $SiO_2$ layer excellent in characteristics of the interface with the semiconductor layer including silicon (Si) and the like is formed as the lowest layer. Therefore, the characteristics of the first and second circuit elements can be further improved. In addition, the upper part of the above-mentioned second insulating film is a $SiN_x$ layer. Therefore, the second conductive layer can be formed by dry etching such as plasma etching without plasma-damaging the second insulating film. Accordingly, the reliability of the second insulating film is maintained, and simultaneously not only the second conductive layer but also the second circuit element can be finely formed.

In addition, because of the above-mentioned reason, it is more preferable that the above-mentioned first insulating film and the lower part of the second insulating film have a structure in which a silicon oxide layer and a silicon nitride layer are stacked in this order, and the upper part of the above-mentioned second insulating film is a silicon nitride layer.

It is preferable in the above-mentioned first semiconductor device that the first circuit element and the second circuit element are thin film transistors. According to this, mass production of a semiconductor device which includes the TFT capable of improving the performances and the TFT capable of increasing the withstand voltage on the same substrate and which sufficiently secures the reliability is permitted.

It is more preferable that the first circuit element is a thin film transistor in a driving circuit part, and the second circuit element is a thin film transistor in a pixel circuit part. According to the first semiconductor device (active matrix substrate), the driving circuit part can operate at a high-speed by using the first circuit element capable of improving the performances as a TFT in the driving circuit part. Further, a reduction in contrast or a reduction in image qualities in a panel can be suppressed by using the second circuit element capable of increasing a withstand voltage and reducing an off-state current as a TFT in the pixel circuit part.

If the above-mentioned first and second circuit elements are thin film transistors, it is preferable that the first circuit element or the second circuit element has a contact hole penetrating the silicon nitride layer. The above-mentioned $SiN_x$ layer has a resistance to plasma. Therefore, the contact hole can be formed by the following method without plasma-damaging the first semiconductor layer and the like. In a contact etching step, dry etching is performed within the range from the lower surface to the upper surface of the $SiN_x$ film, that is, such that the $SiN_x$ film remains on the etching surface, and then wet etching is performed. As a result, the reliability of the first or second circuit element can be more sufficiently secured. The use of the dry etching makes it possible to finely form not only the contact hole but also the first or second circuit element.

In the present description, the contact hole is a hole penetrating at least the gate insulating films of the first or second circuit element. A conductive layer is generally formed inside the contact hole and connected to the semiconductor layer. The dry etching may be reactive ion etching, but generally plasma etching.

It is preferable in the above-mentioned first semiconductor device that the first circuit element is a thin film transistor, and the second circuit element is a storage capacitor element. According to this, mass production of a semiconductor device which includes the TFT capable of improving the performances and the storage capacitor element capable of increasing the withstand voltage on the same substrate and which sufficiently secures the reliability is permitted.

It is preferable that the first circuit element is a thin film transistor in a driving circuit part, and the second circuit element is a storage capacitor element in a pixel circuit part. According to such a first semiconductor device (active matrix substrate), the driving circuit part can operate at a high speed by using the first circuit element capable of improving the performances as a TFT in the driving circuit part. In addition, a reduction in image qualities inside a panel can be suppressed by using the second circuit element capable of improving a withstand voltage as a storage capacitor element in the pixel circuit part.

The present invention is also a production method of the first semiconductor device, wherein the first insulating film and the lower part of the second insulating film are formed in the same step. According to this, the production steps can be simplified in comparison to the method in which the first insulating film and the lower part of the second insulating film are formed in different steps. It is preferable that the first insulating film and the lower part of the second insulating film are formed by a plasma CVD method.

The present invention is also a production method of the above-mentioned first semiconductor device, wherein at least part of the third insulating film and the upper part of the second insulating film are formed in the same step. According to this, the production steps can be simplified in comparison to the method in which at least part of the third insulating film and the upper part of the second insulating film are formed in different steps. In addition, it is preferable that at least part of the above-mentioned third insulating film and the upper part of the second insulating film are formed by a plasma CVD method. In order to more simplify the production steps, it is more preferable that the above-mentioned first insulating film and the lower part of the second insulating film are formed in the same step and at least part of the above-mentioned third insulating film and the upper part of the second insulating film are formed in the same step.

The second semiconductor device of the present invention is mentioned in more detail below.

The second semiconductor device of the present invention is a semiconductor device including a first circuit element and a second circuit element on a substrate, the first circuit element having a structure in which a first semiconductor layer, a first insulating film, and a first conductive layer are stacked in this order, and the second circuit element having a structure in which a second semiconductor layer, a second insulating film having a thickness larger than a thickness of the first insulating film, and a second conductive layer are stacked in this order, wherein the second insulating film has a lower part and an upper part, the lower part includes a silicon nitride layer as the uppermost layer, and the upper part includes a structure of the first insulating film (for example, refer to FIG. 2($a$)). The second semiconductor device of the present invention is the same as the above-mentioned first semiconductor device in that the uppermost layer in the lower part of the second insulating film is a silicon nitride layer (for example, refer to FIGS. 1 and 2($a$)). Therefore, according to the second semiconductor device of the present invention, the same operation and effects as in the first semiconductor device, with regard to the second circuit element, can be obtained.

The first insulating film and the upper part of the second insulating film have a single-layer structure or a multilayer structure. The above-mentioned first insulating film and the upper part of the second insulating film may include a (integrated) layer formed in the same step. If the above-mentioned first insulating film and the upper part of the second insulating film have a multilayer structure, it is preferable that all of the layers constituting the first insulating film and the layers constituting the upper part of the second insulating film are formed in the same steps, respectively.

In addition, the lower part of the above-mentioned second insulating film may have a single-layer structure, but preferably a multilayer structure. If the above-mentioned lower part of the second insulating film has a multilayer structure, $SiO_2$ and the like which forms an excellent interface with the second semiconductor layer can be selected as the material for the lowest layer (in the lower part) of the second insulating film. As a result, the second circuit element can secure excellent transfer characteristics and the like.

It is preferable that the above-mentioned first and second conductive layers are formed in the same step.

The preferable embodiments of the second semiconductor device of the present invention are the same as in the first semiconductor device of the present invention. The preferable embodiments in the above-mentioned second semiconductor device are mentioned below, but the detail explanation thereof is omitted because it is the same as in the first semiconductor device of the present invention.

It is preferable that the first circuit element includes a third insulating film below the first semiconductor layer, the lower part of the second insulating film has a structure of the third insulating film formed below the first semiconductor layer (for example, refer to FIG. 2($b$)). According to this, the patterning steps and the like performed when the above-mentioned lower part of the above-mentioned second insulating film is formed are reduced, thereby simplifying the production steps.

The above-mentioned third insulating film may have a single-layer structure or a multilayer structure. Examples of the configuration of the lower part of the second insulating film include a configuration (1) in which the lower part of the second insulating film has a structure of the middle part of the third insulating film, a configuration (2) in which it has a structure of the lower part of the third insulating film, a configuration (3) in which it has a structure of the upper part of the third insulating film, and a configuration (4) in which it has the entire structure of the third insulating film. In order to reduce the patterning steps and the like performed when the third insulating film is formed, the configurations (2) and (3) are preferable and the configuration (4) is more preferable.

It is preferable that the first insulating film and the upper part of the second insulating film include a silicon nitride layer or a silicon oxide layer as the lowest layer. According to this, the impurities adhering on the $SiN_x$ layer that is the uppermost layer in the lower part of the second insulating film can be trapped on the interface between the $SiN_x$ layers or on the interface between the $SiN_x$ layer and the $SiO_2$ layer. The reliability of the first and second circuit elements can be more sufficiently secured.

It is preferable that the first insulating film and the second insulating film include a silicon oxide layer as the lowest layer. According to this, an excellent interface between the first semiconductor layer and the second semiconductor layer can be formed, and therefore the characteristics of the first and second circuit element can be further improved.

It is preferable that the first insulating film, the lower part of the second insulating film, and the upper part of the second insulating film have a structure in which a silicon oxide layer and a silicon nitride layer are stacked in this order. If the lowest layer of the first insulating film is a $SiO_2$ layer, an excellent interface with the first semiconductor layer including silicon (Si) and the like can be formed. Therefore, the characteristics of the first circuit element can be further improved. Further, if the uppermost layer of the first insulating film is a $SiN_x$ layer, the first and second conductive layers can be formed by dry etching without plasma-damaging the first insulating film. Further, if the lowest layer in the lower part of the second insulating film is a $SiO_2$ layer, an excellent interface with the second semiconductor layer including Si and the like can be formed. As a result, the characteristics of the second circuit element can be further improved. Further, if the uppermost layer in the lower part of the second insulating film is a $SiN_x$ layer, the first semiconductor layer can be formed by dry etching without plasma-damaging the second insulating film, and simultaneously, the impurities are trapped on this $SiN_x$ layer. As a result, the reliability of the second circuit element can be further secured. If the uppermost layer in the upper part of the second insulating film is a $SiN_x$ layer, the first and second conductive layers can be formed by dry etching without plasma-damaging the second insulating film.

It is preferable in the second semiconductor device that the first circuit element and the second circuit element are thin film transistors.

It is preferable that the first circuit element is a thin film transistor in a driving circuit part, and the second circuit element is a thin film transistor in a pixel circuit part.

If the above-mentioned first and second circuit elements are thin film transistors, it is preferable that the first circuit element or the second circuit element has a contact hole penetrating the silicon nitride layer.

It is preferable in the second semiconductor device that the first circuit element is a thin film transistor, and the second circuit element is a storage capacitor element.

It is preferable that the first circuit element is a thin film transistor in a driving circuit part, and the second circuit element is a storage capacitor element in a pixel circuit part.

According to these, the same operation and effects as in the first semiconductor device of the present invention can be obtained.

The present invention is further a production method of the above-mentioned second semiconductor device, wherein the first insulating film and the upper part of the second insulating film are formed in the same step.

The present invention is further a production method of the above-mentioned second semiconductor device, wherein at least part of the third insulating film and the lower part of the second insulating film are formed in the same step.

According to these production methods, the same operation and effects as in the production method of the first semiconductor device of the present invention can be obtained.

The third semiconductor device of the present invention is mentioned below in more detail.

The third semiconductor device of the present invention is a semiconductor device including a first circuit element and a second circuit element on a substrate, the first circuit element having a structure in which a first conductive layer, a first insulating film, and a first semiconductor layer are stacked in this order, the second circuit element having a structure in which a second conductive layer, a second insulating film having a thickness larger than a thickness of the first insulating film, and a second semiconductor layer are stacked in this order, wherein the first insulating film has a structure in which the lowest layer is a silicon nitride layer, the second insulating film has a lower part and an upper part, and the upper part has the structure of the first insulating film (for example, refer to FIG. 3(a)). The third semiconductor device of the present invention is the same as the first semiconductor device except that, in the first and second circuit elements, the conductive layer, the insulating film, and the semiconductor layer are stacked in this order and that the lower part of the second insulating film (corresponding the upper part of the second insulating film in the first semiconductor device) is not necessarily specified (for example, refer to FIGS. 1 and 3(a)). Therefore, according to the third semiconductor device of the present invention, the same operation and effects as in the first semiconductor device, with regard to the above-mentioned second circuit element, can be obtained, except for the operation and effects attributed to the multilayer structure in the lower part of the second insulating film.

Examples of the TFTs in the above-mentioned third semiconductor device include a TFT having a bottom-gate structure and a TFT having a dual-gate structure. A TFT having a bottom-gate structure is preferable.

The above-mentioned first insulating film and the upper part of the second insulating film may have a single-layer structure, but preferably have a multilayer structure. If the above-mentioned first insulating film has a multilayer structure, $SiO_2$ and the like which forms an excellent interface with the first semiconductor layer can be selected independently from the material ($SiN_x$) for the lowest layer of the first insulating film, as the material for the uppermost layer of the first insulating film. As a result, the first circuit element can secure excellent transfer characteristics and the like. Further, if the upper part of the above-mentioned second insulating film has a multilayer structure, $SiO_2$ and the like which forms an excellent interface with the second semiconductor layer can be selected independently from the material ($SiN_x$) for the lowest layer in the upper part of the second insulating film, as the material for the uppermost layer (in the upper part) of the second insulating film. As a result, the second circuit element also can secure excellent transfer characteristics and the like.

It is preferable that the lower part of the above-mentioned second insulating film is a silicon nitride layer as the lowest layer. According to this, diffusion of mobile ions such as Na from the substrate such as a glass substrate can be prevented, and the reliability of the second circuit element such as a TFT can be maintained.

The preferable embodiments of the third semiconductor device of the present invention are the same as in the first semiconductor device of the present invention. The preferable embodiments in the above-mentioned third semiconductor device are mentioned below, but the detail explanation thereof is omitted because it is the same as in the first semiconductor device of the present invention.

It is preferable that the first circuit element includes a third insulating film below the first conductive layer, and the lower part of the second insulating film has a structure of the third insulating film formed below the first conductive layer (for example, refer to FIG. 3(b)). According to this, the patterning steps and the like performed when the above-mentioned lower part of the second insulating film is formed are reduced, thereby simplifying the production steps.

The structure of the above-mentioned third insulating film may be a single-layer structure or a multilayer structure. Examples of the configuration of the lower part of the second insulating film include a configuration (1) in which the lower part of the second insulating film has a structure of the middle part of the third insulating film, a configuration (2) in which it has a structure of the lower part of the third insulating film, a configuration (3) in which it has a structure of the upper part of the third insulating film, and a configuration (4) in which it has the entire structure of the third insulating film. The configurations (2) and (3) are preferable and the configuration (4) is more preferable in order to reduce the patterning steps and the like performed when the third insulating film is formed.

It is preferable that the lower part of the second insulating film includes a silicon nitride film as the uppermost layer.

It is preferable that the lower part of the second insulating film includes a silicon oxide film as the uppermost layer.

It is preferable that the first insulating film and the second insulating film include a silicon oxide layer as the uppermost layer.

It is preferable that the first insulating film and the upper part of the second insulating film have a structure in which a silicon nitride layer and a silicon oxide layer are stacked in this order, and the lower part of the second insulating film is a silicon nitride layer.

It is preferable that the first insulating film and the upper part of the second insulating film have a structure in which a silicon nitride layer and a silicon oxide layer are stacked in this order, and the lower part of the second insulating film is a silicon oxide layer.

It is preferable in the third semiconductor device that the first circuit element and the second circuit elements are thin film transistors.

It is preferable that the first circuit element is a thin film transistor in a driving circuit part and the second circuit element is a thin film transistor in a pixel circuit part.

It is preferable in the third semiconductor device that the first circuit element is a thin film transistor and the second circuit element is a storage capacitor element.

It is preferable that the first circuit element is a thin film transistor in a driving circuit part, and the second circuit element is a storage capacitor element in a pixel circuit part.

According to these, the same operation and effects as in the first semiconductor device of the present invention can be obtained.

The present invention is also a production method of the above-mentioned third semiconductor device, wherein the first insulating film and the upper part of the second insulating film are formed in the same step.

The present invention is further a production method of the above-mentioned third semiconductor device, wherein at least part of the third insulating film and the lower part of the second insulating film are formed in the same step. According to these production methods, the same operation and effects as in the production method of the first semiconductor device of the present invention can be obtained.

The fourth semiconductor device of the present invention is mentioned in more detail below.

The fourth semiconductor device of the present invention is a semiconductor device including a first circuit element and a second circuit element on a substrate, the first circuit element having a structure in which a first conductive layer, a first insulating film, and a first semiconductor layer are stacked in this order, the second circuit element having a structure in which a second conductive layer, a second insulating film having a thickness larger than a thickness of the first insulating film, and a second conductive layer are stacked in this order, wherein the second insulating film includes a lower part and an upper part, the lower part has a structure of the first insulating film, and the upper part includes a silicon nitride layer as the lowest layer (for example, refer to FIG. 4(a)).

The fourth semiconductor device of the present invention is the same as in the above-mentioned third semiconductor device in that the lowest layer in the upper part of the second insulating film is a $SiN_x$ layer (for example, refer to FIGS. 3 and 4(a)). Therefore, according to the fourth semiconductor device of the present invention, the same operation and effects as in the third semiconductor device, with regard to the second circuit element, can be obtained.

Examples of the TFTs in the above-mentioned fourth semiconductor device include a TFT having a bottom-gate structure and a TFT having a dual-gate structure. A TFT having a bottom-gate structure is preferable.

It is preferable that the above-mentioned first insulating film and the lower part of the second insulating film may have a single-layer structure, but preferably have a multilayer structure. In the case where the above-mentioned first insulating film has a multilayer structure, $SiO_2$ and the like which forms an excellent interface with the first semiconductor layer can be selected as the material for the uppermost layer of the first insulating film even if a $SiN_x$ layer needs to be formed inside the first insulating film as mentioned below. As a result, the first circuit element can secure excellent transfer characteristics. Further, in the case where the lower part of the above-mentioned second insulating film has a multilayer structure, $SiN_x$ can be selected as a material for the lowest layer in the lower part of the second insulating film even if $SiO_2$ and the like needs to be selected as a material for the uppermost layer of the first insulating film, that is, the uppermost layer in the lower part of the second insulating film. As a result, $SiN_x$ in the multilayer film prevents diffusion of mobile ions such as Na from the substrate such as a glass substrate. Therefore, the reliability of the second circuit element such as a TFT can be secured.

The upper part of the above-mentioned second insulating film may have a single-layer structure, but preferably has a multilayer structure. If the upper part of the above-mentioned second insulating film has a multilayer structure, $SiO_2$ and the like which forms an excellent interface with the second semiconductor layer can be selected independently from the material ($SiN_x$) for the lowest layer, as the material for the uppermost layer (in the upper part) of the second insulating film. As a result, the second circuit element also can secure excellent transfer characteristics.

In addition, it is preferable that the above-mentioned first and second conductive layers are formed in the same step.

The preferable embodiments of the fourth semiconductor device of the present invention are the same as in the first semiconductor device of the present invention. The preferable embodiments in the above-mentioned fourth semiconductor device are mentioned below, but the detail explanation thereof is omitted because it is the same as in the first semiconductor device of the present invention.

It is preferable that the first circuit element includes a third insulating film on the first semiconductor layer, and the upper part of the second insulating film has a structure of the third insulating film formed on the first semiconductor layer (for example, refer to FIG. 4(b)). According to this, the patterning steps and the like performed when the upper part of the above-mentioned second insulating film is formed are reduced, thereby simplifying the production steps.

The above-mentioned third insulating film may have a single-layer structure or a multilayer structure. Examples of the configuration of the upper part of the above-mentioned second insulating film include a configuration (1) in which the upper part of the second insulating film has a structure of the middle part of the third insulating film, a configuration (2) in which it has a structure of the lower part of the third insulating film, a configuration (3) in which it has a structure of the upper part of the third insulating film, and a configuration (4) in which it has the entire structure of the third insulating film. In order to reduce the patterning steps and the like performed when the third insulating film is formed, the configurations (2) and (3) are preferable and the configuration (4) is more preferable.

It is preferable that the first insulating film and the lower part of the second insulating film include a silicon nitride layer as the uppermost layer.

It is preferable that the first insulating film and the lower part of the second insulating film include a silicon oxide layer as the uppermost layer.

It is preferable that the first insulating film and the second insulating film include a silicon oxide layer as the uppermost layer.

It is preferable that the first insulating film and the lower part of the second insulating film are silicon nitride layers, and the upper part of the second insulating film has a structure in which a silicon nitride layer and a silicon oxide layer are stacked in this order.

It is preferable that the first insulating film and the lower part of the second insulating film are silicon oxide layers, and the upper part of the second insulating film has a structure in which a silicon nitride layer and a silicon oxide layer are stacked in this order.

It is preferable in the above-mentioned fourth semiconductor device that the first circuit element and the second circuit element are thin film transistors.

It is preferable that the first circuit element is a thin film transistor in a driving circuit part, and the second circuit element is a thin film transistor in a pixel circuit part.

It is preferable in the above-mentioned fourth semiconductor device that the first circuit element is a thin film transistor and the second circuit element is a storage capacitor element.

It is preferable that the first circuit element is a thin film transistor in a driving circuit part, and the second circuit element is a storage capacitor element in a pixel circuit part.

According to these, the same operation and effects as in the first semiconductor device of the present invention can be obtained.

The present invention is further a production method of the above-mentioned fourth semiconductor device, wherein the first insulating film and the lower part of the second insulating film are formed in the same step.

The present invention is further a production method for the above-mentioned fourth semiconductor device, wherein at least part of the third insulating film and the upper part of the second insulating film are formed in the same step.

According to these production methods, the same operation and effects as in the production method of the first semiconductor device of the present invention can be obtained.

The present invention is also a display device including the above-mentioned first, second, third, or fourth semiconductor device. The first to fourth semiconductor devices of the present invention are excellent in reliability. Therefore, in the display device, a reduction in fraction defective or an improvement in yield is permitted. Further, the TFT in the pixel circuit part and the TFT in the peripheral circuit part can be formed on the same substrate. Therefore, a system-on-glass display device can be provided, and downsizing, a reduction in electric power consumption, and high reliability of the display device can be achieved. A liquid crystal display device, an organic electroluminescent display device and the like are preferable as the above-mentioned display device.

EFFECT OF THE INVENTION

According to the semiconductor device of the present invention, TFTs including gate insulating films having different thicknesses can be formed on the same substrate without plasma-damaging the gate insulating films and without diffusing impurities into the gate insulating films or the semiconductor layers. Therefore, the reliability can be sufficiently secured, and each TFT can improve the performances and increase the withstand voltage.

BEST MODES FOR CARRYING OUT THE INVENTION

The present invention is mentioned in more detail below with respect to the following Embodiments, but not limited to only these Embodiments.

Embodiment 1

FIG. 5 is a cross-sectional view schematically showing a configuration of an active matrix substrate (semiconductor device) according to Embodiment 1 of the present invention.

As shown in FIG. 5, the active matrix substrate according to the present Embodiment includes, on a glass substrate 10, a top-gate type N-channel TFT (the first circuit element) 100a and a top-gate type P-channel TFT (the first circuit element) 100b, each having an offset structure for a driving circuit, and a top-gate type N-channel TFT (the second circuit element) 200 having an LDD (Lightly Doped Drain) structure for pixel switching, and the like. As shown in FIG. 5, the gate insulating films (the first insulating films) of the TFTs 100a and 100b have a two-layer structure composed of a silicon oxide ($SiO_2$) film 16 and a silicon nitride ($SiN_x$) film 17. In contrast, the gate insulating film (the second insulating film) of the TFT 200 has a three-layer structure composed of the $SiO_2$ film 16, the $SiN_x$ film 17, and a $SiN_x$ film 18.

Production steps of an active matrix substrate in accordance with the present Embodiment are mentioned with reference to FIGS. 6-1(a) to 6-1(f) and 6-2(a) to 6-2(g).

As shown in FIG. 6-1(a), a hydrogen barrier and impurity diffusion-preventing film 11 composed of $SiN_x$, a buffer film 12 composed of $SiO_2$, an amorphous silicon (a-Si) film 13 are formed on a glass substrate 10. The hydrogen barrier and impurity diffusion-preventing film 11 has a thickness of 50 nm. The buffer film 12 has a thickness of 100 nm. The a-Si film 13 has a thickness of 50 nm.

Then, as shown in FIG. 6-1(b), the a-Si film 13 is irradiated with laser light 1 to be crystallized, thereby forming a polysilicon (p-Si) film 14. For this crystallization, (1) a Solid Phase Crystallization (SPC) method and (2) a combination of the SPC method with laser irradiation light may be used.

As shown in FIG. 6-1(c), the p-Si film 14 is patterned into each TFT size. As a result, p-Si layers (the first semiconductor layers) 15a and 15b, and a p-Si layer (the second semiconductor layer) 15c are formed.

Then, ultraviolet (UV) cleaning, ozone ($O_3$) cleaning, hydrofluoric acid (HF) cleaning, water cleaning, alkali cleaning, and the like, is performed to remove the impurities and the organic film. Successively, as shown in FIG. 6-1(d), exposure to hydrogen ($H_2$) plasma or $H_2$ gas 2 is performed, and then as shown in FIG. 6-1(e), a $SiO_2$ film 16 and a $SiN_x$ film 17 are formed. According to the present Embodiment, the $SiO_2$ film 16 and the $SiN_x$ film 17 are continuously formed by a plasma chemical vapor deposition (CVD) method. Each of the $SiO_2$ film 16 and the $SiN_x$ film 17 has a thickness of 30 nm.

Then, using a sputtering method or a CVD method and the like, a metal film is deposited and then patterned using etching gas. As a result, as shown in FIG. 6-1(f), gate electrodes (the first conductive layers) 21a and 21b are formed. As the material of gate electrodes 21a and 21b, a multilayer structure of a compound including aluminum (Al), tantalum (Ta), tungsten (W), molybdenum (Mo) and the like, or a multilayer structure of a metal of such compounds. As the etching gas, sulfur hexafluoride (SF$_6$) gas, carbon tetrafluoride (CF$_4$) gas or mixed gas of these gases with oxygen (O$_2$) gas may be mentioned.

Then, UV cleaning, O$_3$ cleaning, HF cleaning, water cleaning, alkali cleaning, and the like, is performed to remove the impurities and the organic film, and then, as shown in FIG. 6-2(a), a SiN$_x$ film 18 is formed. In the present Embodiment, the SiN$_x$ film 18 has a thickness of 60 nm. Preferable examples of the structure of this insulating film 18 include a single-layer structure only composed of a SiN$_x$ film, as in the present invention; and a multilayer structure composed of a SiN$_x$ film (lower layer) with a thickness of 20 nm and a SiO$_2$ film (upper layer) with a thickness of 20 nm. A single-layer structure only composed of SiO$_2$, a multilayer structure composed of a SiO$_2$ film (lower layer) and a SiN$_x$ film (upper layer), and the like may be used.

As shown in FIG. 6-2(b), a gate electrode (the second conductive layer) 21c is formed. The material, film thickness, and formation method of the gate electrode 21c may be different from those of the gate electrodes 21a and 21b, and may be the same as in a source electrode, for example.

As shown in FIG. 6-2(c), a photoresist layer 19 covering the gate electrode 21c is formed, and then impurities 3 are injected into p-Si layers 15a to 15c. Specifically, phosphorus ions (P$^+$) are injected into the p-Si layers 15a and 15c and then boron ions (B$^+$) are injected into the p-Si layer 15b. The photoresist layer 19 is removed, and then into the p-Si layer 15c, phosphorus ions (P$^+$) at a low concentration are injected. As a result, in the p-Si layer 15a, an offset region 22 and an n-type high-concentration impurity region 23a are formed in a self-aligning manner. In the p-Si layer 15b, an offset region 22 and a p-type high-concentration impurity region 24a are formed in a self-aligning manner. In the p-Si layer 15c, an n-type high-concentration impurity region 23a and an n-type low-concentration impurity region (LDD region) 23b are formed.

Successively, annealing (activation annealing) is performed, thereby activating the injected impurities.

Then, as shown in FIG. 6-2(d), an interlayer insulating film 25 is formed. SiN$_x$, SiO$_2$ and the like may be used as a material for the interlayer insulating film 25. In the present Embodiment, the interlayer insulating film 25 has a single-layer structure composed of a SiO$_2$ film. However, it may have a multilayer structure composed of a SiN$_x$ film (lower layer) and a SiO$_2$ film (upper layer). Successively, the p-Si layers 15a to 15c are hydrogenated by annealing (hydrogenation annealing), thereby terminating a dangling bond.

Then, contact etching is performed. Specifically, as shown in FIG. 6-2(e), the part on the SiN$_x$ film 17 is dry-etched and then, as shown in FIG. 6-2(f), the part on the p-Si layers 15a to 15c is wet-etched, thereby forming contact holes 27a to 27.

Finally, as shown in FIG. 6-2(g), source electrodes 28a to 28c are formed. As a result, an N-channel driving circuit TFT 100a, a P-channel driving circuit TFT 100b, and an N-channel pixel switching TFT 200 are completed.

According to the production method of the present Embodiment, in the step of forming the gate electrodes 21a and 21b shown in FIG. 6-1(f), the metal film is subjected to dry etching or ashing. At this time, however, the SiN$_x$ film 17 having a high resistance to plasma is arranged as the uppermost layer. Therefore, the SiO$_2$ film 16 and the like are not damaged by the etching or ashing. Because of the same reason, even in the contact etching step shown in FIG. 6-2(e), plasma damage on the SiO$_2$ film 16 and the like can be reduced. Further, the SiN$_x$ film 17 and the SiN$_x$ film 18 are formed in different steps. Accordingly, impurities such as boron (B), sodium (Na), phosphorus (P), and a heavy metal adhere on the SiN$_x$ film 17. However, the SiN$_x$ film 17 has an impurity diffusion-preventing (barrier) function. Therefore, these impurities can be suppressed from diffusing into not only the SiO$_2$ film 16 but also the p-Si layers 15a to 15c in the activation annealing step or the hydrogenation annealing step and the like.

Therefore, according to the production method of the present Embodiment, an active matrix substrate with high reliability can be prepared.

Embodiment 2

FIG. 7 is a cross-sectional view schematically showing a configuration of an active matrix substrate (semiconductor device) in accordance with Embodiment 2 of the present invention.

The active matrix substrate in accordance with the present Embodiment is the same as the active matrix substrate in Embodiment 1, except that driving circuit TFTs 100a and 100b have a self-alignment structure. That is, as shown in FIG. 7, the active matrix substrate according to the present Embodiment includes, on a glass substrate 10, a top-gate type N-channel TFT (the first circuit element) 100a and a top-gate type P-channel TFT (the first circuit element) 100b, each having a self-alignment structure for a driving circuit, and a top-gate type N-channel TFT (the second circuit element) 200 having an LDD structure for pixel switching, and the like. As shown in FIG. 7, gate insulating films (the first insulating films) of the TFTs 100a and 100b have a two-layer structure composed of a silicon oxide (SiO$_2$) film 16 and a silicon nitride (SiN$_x$) film 17. In contrast, a gate insulating film (the second insulating film) of the TFT 200 has a three-layer structure composed of the SiO$_2$ film 16 and the SiN$_x$ film 17, and a SiN$_x$ film 18.

The production steps of the active matrix substrate according to the present Embodiment are mentioned with reference to FIGS. 6-1(a) to 6-1(f) and FIGS. 8(a) to 8(h).

First, the same steps as in FIGS. 6-1(a) to 6-1(f) in Embodiment 1 are performed.

Then, as shown in FIG. 8(a), impurities 3 are injected into the p-Si layers 15a and 15b. Specifically, phosphorus ions (P$^+$) are injected into the p-Si layer 15a and boron ions (B$^+$) are injected into the p-Si layer 15b. Accordingly, in the p-Si layer 15a, an n-type high-concentration impurity region 23a is formed in a self-aligning manner, and in the p-Si layer 15b, a p-type high-concentration impurity region 24a is formed in a self-aligning manner.

Then, UV cleaning, O$_3$ cleaning, HF cleaning, water cleaning, alkali cleaning, and the like, is performed to remove the impurities and the organic film, and then, as shown in FIG. 8(b), a SiN$_x$ film 18 is formed. In the present Embodiment, the SiN$_x$ film 18 has a thickness of 60 nm. Preferable examples of the structure of this insulating film 18 include a single-layer structure composed of only a SiN$_x$ film, as in the present Embodiment; and a multilayer structure composed of a SiN$_x$ film (lower layer) with a thickness of 20 nm and a SiO$_2$ film (upper layer) with a thickness of 20 nm. A single-layer structure only composed of SiO$_2$, a multilayer structure composed of a SiO$_2$ film (lower layer) and a SiN$_x$ film (upper layer), and the like may be used.

As shown in FIG. 8(c), a gate electrode (the second conductive layer) 21c is formed. The material, thickness, and formation method of the gate electrode 20c may be different from those of the gate electrodes 21a and 21b, and may be the same as in a source electrode, for example.

As shown in FIG. 8(d), a photoresist layer 19 covering the gate electrode 20c is formed, and then phosphorus ions (P$^+$)

are injected into the p-Si layer 15c. The photoresist layer 19 is removed, and then, into the p-Si layer 15c, P$^+$ ions at a low concentration are further injected. As a result, in the p-Si layer 15c, an n-type high-concentration impurity region 23a and an n-type LDD region 23b are formed.

Successively, annealing (activation annealing) is performed, thereby activating injected impurities.

Then, as shown in FIG. 8(e), an interlayer insulating film 25 is formed. Examples of the material for the interlayer insulating film 25 include SiN$_x$ and SiO$_2$. In the present Embodiment, the interlayer insulating film 25 has a single-layer structure composed of a SiO$_2$ film, but may have a multilayer structure composed of a SiN$_x$ film (lower layer) and a SiO$_2$ film (upper layer), for example.

Successively, the p-Si layers 15a to 15c are hydrogenated by annealing (hydrogenation annealing), thereby terminating a dangling bond.

Successively, contact etching is performed. Specifically, as shown in FIG. 8(f), the part on the SiN$_x$ film 17 is dry-etched and then, as shown in FIG. 8(g), the part on the p-Si layers 15a to 15c is wet-etched, thereby forming contact holes 27a to 27c.

Finally, as shown in FIG. 8(h), source electrodes 28a to 28c are formed. As a result, an N-channel driving circuit TFT 100a, a P-channel driving circuit TFT 100b, and a pixel switching TFT 200 are completed.

Also in accordance with the present Embodiment, the same operation and effects as in Embodiment 1 can be obtained because of the SiN$_x$ film 17.

Embodiment 3

FIG. 9 is a cross-sectional view schematically showing a configuration of an active matrix substrate (semiconductor device) in accordance with Embodiment 3 of the present invention.

As shown in FIG. 9, the active matrix substrate in accordance with the present Embodiment includes, on a glass substrate 10, a top-gate type N-channel TFT (the first circuit element) 100a and a top-gate type P-channel TFT (the first circuit element) 100b, each having a self-alignment structure for a driving circuit, and a top-gate type N-channel TFT (the second circuit element) 200, and the like. As shown in FIG. 9, gate insulating films (the first insulating films) of the TFTs 100a and 100b have a two-layer structure composed of a silicon oxide (SiO$_2$) film 63 and a silicon nitride (SiN$_x$) film 64. In contrast, a gate insulating film (the second insulating film) of the TFT 200 has a four-layer structure composed of a SiO$_2$ film 61, a SiN$_x$ film 62, the SiO$_2$ film 63, and the SiN$_x$ film 64.

The production steps of the active matrix substrate in accordance with the present Embodiment are mentioned below with reference to FIGS. 6-1(a) to 6-1(e) and FIGS. 10(a) to 10(f).

First, the same steps as in FIGS. 6-1(a) to 6-1(e) in Embodiment 1 are performed.

Then, a photoresist layer is formed on the SiO$_2$ film 16 and the SiN$_x$ film 17, and then a region other than a region where a gate insulating film having a four-layer structure is to be formed is removed by wet etching. As a result, as shown in FIG. 10(a), a SiO$_2$ film 61 and a SiN$_x$ film 62 covering the p-Si layer 15c are formed.

Then, UV cleaning, O$_3$ cleaning, HF cleaning, water cleaning, alkali cleaning, and the like, is performed to remove the impurities and the organic film. Successively, a SiO$_2$ film 63 and a SiN$_x$ film 64 are formed, as shown in FIG. 10(b). In the present Embodiment, the SiO$_2$ film 63 and the SiN$_x$ film 64 are continuously formed by a plasma chemical vapor deposition (CVD) method. Each of the SiO$_2$ film 63 and the SiN$_x$ film 64 has a thickness of 20 nm. In the present Embodiment, a two-layer structure composed of the SiO$_2$ film 63 and the SiN$_x$ film 64 is employed, but a single-layer structure composed of only the SiO$_2$ film 63 may be employed.

As shown in FIG. 10(c), a metal film is deposited by a sputtering method, a CVD method and the like, and then patterned using etching gas. As shown in FIG. 10(c), gate electrodes (the first conductive layers) 21a and 21b, and a gate electrode (the second conductive layer) 21c are formed.

Then, as shown in FIG. 10(d), impurities 3 are injected into the p-Si layers 15a to 15c. Specifically, phosphorus ions (P$^+$) are injected into the p-Si layers 15a and 15c, and into the p-Si layer 15b, boron ions (B$^+$) are injected. As a result, in the p-Si layers 15a and 15c, an n-type high-concentration impurity region 23a is formed in a self-aligning manner, and in the p-Si layer 15b, a p-type high-concentration impurity region 24a is formed in a self-aligning manner. In this case, in addition to the high-concentration impurity regions, an LDD (lightly doped drain) region may be formed.

Successively, annealing (activation annealing) is performed, thereby activating the injected impurities.

Then, as shown in FIG. 10(e), an interlayer insulating film 25 is formed. SiN$_x$, SiO$_2$ and the like may be used as a material for the interlayer insulating film 25. In the present Embodiment, the interlayer insulating film 25 has a single-layer structure composed of the SiO$_2$ film, but may have a multilayer structure composed of a SiN$_x$ film (lower layer) and a SiO$_2$ film (upper layer), for example.

Successively, the p-Si layers 15a to 15c are hydrogenated by annealing (hydrogenation annealing), thereby terminating a dangling bond.

Finally, as shown in FIG. 10(f), contact etching is performed and source electrodes 28a to 28c and the like are formed. As a result, an N-channel driving circuit TFT 100a and a P-channel driving circuit TFT 100b, and an N-channel pixel switching TFT 200 are completed.

According to the production method of the present Embodiment, in the step of forming the gate electrodes 21a to 21c shown in FIG. 10(c), the metal film is subjected to dry etching or ashing. At this time, however, the SiN$_x$ film 64 having a high resistance to plasma is arranged as the uppermost layer. Therefore, the SiO$_2$ film 63 and the like are not damaged by the etching or ashing. Further, in the TFT 200, the SiN$_x$ film 62 and the SiO$_2$ film 63 are formed in different steps. Accordingly, impurities such as boron (B), sodium (Na), phosphorus (P), and a heavy metal adhere on the SiN$_x$ film 62. However, the SiN$_x$ film 62 has an impurity diffusion-preventing (barrier) function. Therefore, these impurities can be suppressed from diffusing into not only the SiO$_2$ film 61 but also the p-Si layer 15c in the activation annealing step or the hydrogenation annealing step and the like.

Therefore, according to the production method of the present Embodiment, an active matrix substrate with high reliability can be prepared.

Embodiment 4

FIG. 11 is a cross-sectional view schematically showing a configuration of an active matrix substrate (semiconductor device) in accordance with Embodiment 4 of the present invention.

As shown in FIG. 11, the active matrix substrate according to the present Embodiment includes, on a glass substrate 10, a top-gate type N-channel TFT (the first circuit element) 100a and a top-gate type P-channel TFT (the first circuit element)

100b, each having a self-alignment structure for a driving circuit, and a storage capacitor (Cs) element (the second circuit element) 300 and the like. As shown in FIG. 11, gate insulating films (the first insulating films) of the TFTs 100a and 100b have a two-layer structure composed of a silicon oxide (SiO$_2$) film 16 and a silicon nitride (SiN$_x$) film 17. In addition, an insulating film (the second insulating film) of the Cs element 300 has a three-layer structure composed of the SiO$_2$ film 16, the SiN$_x$ film 17, and a SiN$_x$ film 18.

The production steps of the active matrix substrate in accordance with the present Embodiment are mentioned with reference to FIGS. 6-1(a) to 6-1(f) and FIGS. 12(a) to 12(g) is mentioned below.

First, the same steps as in FIGS. 6-1(a) to 6-1(f) as in Embodiment 1 are performed.

Then, as shown in FIG. 12(a), impurities 3 are injected into the p-Si layers 15a to 15c. Specifically, phosphorus ions (P$^+$) are injected into the p-Si layers 15a and 15c, and boron ions (B$^+$) are injected into the p-Si layer 15b. As a result, in the p-Si layer 15a, an n-type high-concentration impurity region 23a is formed in a self-aligning manner, and in the p-Si layer 15b, a p-type high-concentration impurity region 24a is formed in a self-aligning manner. Further, an n-type high concentration impurity region 23a is formed in the entire p-Si layer 15c.

Successively, annealing (activation annealing) is performed, thereby activating the injected impurities.

Then, UV cleaning, O$_3$ cleaning, HF cleaning, water cleaning, alkali cleaning, and the like, is performed to remove the impurities and the organic film. Successively, a SiN$_x$ film 18 is formed as shown in FIG. 12(b). In the present Embodiment, the SiN$_x$ film 18 has a thickness of 60 nm. Preferable examples of the structure of this insulating film 18 include a single-layer structure composed of only a SiN$_x$ film, as in the present Embodiment; and a multilayer structure composed of a SiN$_x$ film (lower layer) with a thickness of 20 nm and a SiO$_2$ film (upper layer) with a thickness of 20 nm. A single-layer structure only composed of SiO$_2$, a multilayer structure composed of a SiO$_2$ film (lower layer) and a SiN$_x$ film (upper layer), and the like may be used.

Then, a metal film is deposited by a sputtering method, a CVD method and the like, and then patterned using etching gas. As a result, a storage capacitor wiring (the second conductive layer) 31 is formed, as shown in FIG. 12(c). The material, thickness, and formation method of the storage capacitor wiring 31 may be different from those of the gate electrodes 21a and 21b, and may be the same as those in a source electrode, for example.

Then, as shown in FIG. 12(d), an interlayer insulating film 25 is formed. SiN$_x$, SiO$_2$ and the like may be used as a material for the interlayer insulating film 25. In accordance with the present Embodiment, the interlayer insulating film 25 has a single-layer structure composed of the SiO$_2$ film, but may have a multilayer structure composed of a SiN$_x$ film (lower layer) and a SiO$_2$ film (upper layer), for example.

Successively, the p-Si layers 15a to 15c are hydrogenated by annealing (hydrogenation annealing), thereby terminating a dangling bond.

Successively, contact etching is performed. Specifically, as shown in FIG. 12(e), the part on the SiN$_x$ film 17 is dry-etched and then, as shown in FIG. 12(f), the part on the p-Si layers 15a to 15c is wet-etched, thereby forming contact holes 27a and 27b.

Finally, as shown in FIG. 12(g), source electrodes 28a and 28b are formed. As a result, an N-channel driving circuit TFT 100a and a P-channel driving circuit TFT 100b, and a Cs element 300 are completed.

Also according to the present Embodiment, the same operation and effects as in Embodiment 1 can be obtained because of the SiN$_x$ film 17.

Embodiment 5

FIG. 13 is a cross-sectional view schematically showing a configuration of an active matrix substrate (semiconductor device) in accordance with Embodiment 5 of the present invention.

As shown in FIG. 13, the active matrix substrate in accordance with the present Embodiment includes, on a glass substrate 10, a bottom-gate type N-channel TFT (the first circuit element) 400a and a bottom-gate type N-channel TFT (the first circuit element) 400b, each having a self-alignment structure for a driving circuit, and a bottom-gate type N-channel TFT (the second circuit element) 500 having a self-alignment structure for pixel switching, and the like. As shown in FIG. 13, gate insulating films (the first insulating films) of the TFTs 400a and 400b have a two-layer structure composed of a silicon nitride (SiN$_x$) film 18 and a silicon oxide (SiO$_2$) film 16. In contrast, a gate insulating film (the second insulating film) of the TFT 500 has a three-layer structure composed of a SiN$_x$ film 17, the SiN$_x$ film 18, and the SiO$_2$ film 16.

The production steps of the active matrix substrate according to the present Embodiment are mentioned with reference to FIGS. 14-1(a) to 14-1(h) and 14-2(a) to 14-2(c).

First, a metal film is deposited on a glass substrate 10 by a sputtering method, a CVD method, or the like, and then patterned using etching gas. As a result, a gate electrode (the second conductive layer) 21c is formed, as shown in FIG. 14-1(a).

Then, as shown in FIG. 14-1(b), a SiN$_x$ film 17 is formed by a plasma chemical vapor deposition (CVD) method. In the present Embodiment, the SiN$_x$ film 17 has a thickness of 30 nm.

Then, as shown in FIG. 14-1(c), gate electrodes (the first conductive layers) 21a and 21b are formed. The material, thickness, and formation method of the gate electrodes 21a and 21b may be different from those of the gate electrode 21c.

Then, as shown in FIG. 14-1(d), a SiN$_x$ film 18, a SiO$_2$ film 16, and an amorphous silicon (a-Si) film 13 are formed. The SiN$_x$ film 18, the SiO$_2$ film 16, and the a-Si film 13 are continuously formed by a plasma chemical vapor deposition (CVD) method. According to the present Embodiment, each of the SiN$_x$ film 18 and the SiO$_2$ film 16 has a thickness of 30 nm. The a-Si film 13 has a thickness of 50 nm. Only a SiO$_2$ film with a thickness of 45 nm may be used instead of the SiN$_x$ film 18 and the SiO$_2$ film 16, for example.

Then, as shown in FIG. 14-1(e), the a-Si film 13 is irradiated with laser light 1 to be crystallized, thereby forming a polysilicon (p-Si) film 14. For this crystallization, (1) a Solid Phase Crystallization (SPC) method and (2) a combination of the SPC method with laser irradiation light may be used.

As shown in FIG. 14-1(f), the p-Si film 14 is patterned into each TFT size, thereby forming p-Si layers (the first semiconductor layers) 15a and 15b, and a p-Si layer (the second semiconductor layer) 15c.

Then, UV cleaning, O$_3$ cleaning, HF cleaning, water cleaning, alkali cleaning, and the like, is performed to remove the impurities and the organic film. Successively, as shown in FIG. 14-1(g), exposure to hydrogen (H$_2$) plasma or H$_2$ gas 2 is performed, and then as shown in FIG. 14-1(h), a SiO$_2$ film 61 and a SiN$_x$ film 62 are formed. According to the present Embodiment, the SiO$_2$ film 61 and the SiN$_x$ film 62 are continuously formed by a plasma chemical vapor deposition (CVD) method. Each of the SiO$_2$ film 61 and the SiN$_x$ film 62 has a thickness of 30 nm.

Exposure to H$_2$ plasma or H$_2$ gas 2 may be performed after the SiO$_2$ film 61 is formed.

Then, as shown in FIG. 14-2(a), a photoresist layer 68 is formed on the SiN$_x$ film 62, and then impurities 3 are injected into the p-Si layers 15a to 15c. Specifically, into the p-Si layers 15a and 15c, phosphorus ions (P$^+$) are injected, and into the p-Si layer 15b, boron ions (B$^+$) are injected. As a result, in the p-Si layers 15a and 15c, an n-type high-concentration impurity region 23a is formed in a self-aligning manner. In the p-Si layer 15b, a p-type high-concentration impurity region 24a is formed in a self-aligning manner.

Then, annealing (activation annealing) is performed, thereby activating the injected impurities.

Then, as shown in FIG. 14-2(b), an interlayer insulating film 25 composed of SiO$_2$ is formed. Then, the p-Si layers 15a to 15c are hydrogenated by annealing (hydrogenation annealing), thereby terminating a dangling bond.

Finally, as shown in FIG. 14-2(c), contact etching is performed and source electrodes 28a to 28c are formed. As a result, an N-channel driving circuit TFT 400a and a P-channel driving circuit TFT 400b, and an N-channel pixel switching TFT 500 are completed.

According to the production method of the present Embodiment, the SiN$_x$ film 17 and the SiN$_x$ film 18 are formed in different steps. Accordingly, impurities such as boron (B), sodium (Na), phosphorus (P), and a heavy metal adhere on the SiN$_x$ film 17. However, the SiN$_x$ film 18 has an impurity diffusion-preventing (barrier) function. Therefore, the impurities can be suppressed from diffusing into not only the SiO$_2$ film 16 but also the p-Si layers 15a to 15c in the activation annealing step or the hydrogenation annealing step and the like.

Therefore, according to the production method of the present Embodiment, an active matrix substrate with high reliability can be prepared.

Embodiment 6

FIG. 15 is a cross-sectional view schematically showing a configuration of an active matrix substrate (semiconductor device) according to Embodiment 6 of the present invention.

As shown in FIG. 15, the active matrix substrate according to the present Embodiment has the same configuration as in the active matrix substrate according to Embodiment 5, except that an N-channel TFT (the first circuit element) 400a and an N-channel TFT (the first circuit element) 400b, each having a self-alignment structure for a driving circuit, and an N-channel TFT (the second circuit element) 500 having a self-alignment structure for pixel switching are dual-gate type TFTs. That is, the production method of the present Embodiment is the same as the production method in Embodiment 5, except that the production method of the present Embodiment includes a step of upper gate electrodes 41a to 41c. Therefore, also according to the production method of the present Embodiment, an active matrix substrate with high reliability can be prepared.

(Experiment) Plasma Resistance Comparison Test

In this Experiment, silicon oxide (SiO$_2$) and silicon nitride (SiN$_x$) are compared in resistance to plasma. Specifically, a TFT including a gate insulating film composed of a SiO$_2$ layer with a thickness of 70 nm was prepared, and subjected to an oxygen (O$_2$) plasma treatment (Inductively Coupled Plasma (ICP) conditions: Bias 400 W). This TFT was examined for a change in threshold voltage (Vth) characteristics by a BTS (bias temperature stress) test (BTS conditions: 150° C., +20V, for 30 minutes). In addition, the same test was performed for a TFT including a gate insulating film (EOT was about 70 nm) having a two-layer structure composed of a SiO$_2$ layer (lower layer) with a thickness of 50 nm and a SiN$_x$ layer (upper layer) with a thickness of 40 nm. FIGS. 16 and 17 show the results.

If the O$_2$ plasma treatment was not performed, a change between the Vth before the BTS test and the Vth after the BTS test was not observed in both of the TFT including a gate insulating film composed of a SiO$_2$ layer and the TFT including a gate insulating film composed of a SiN$_x$ layer. However, if the O$_2$ plasma treatment was performed, the Vth after the BTS test was shifted in the negative direction in comparison to the Vth before the BTS test in the TFT including a gate insulating film composed of a SiO$_2$ layer, as shown in FIG. 16(b). This is because SiO$_2$ was weak to biased O$_2$ plasma and the gate insulating film was plasma-damaged in the O$_2$ plasma treatment step to be deteriorated. However, in the TFT including a gate insulating film having a two-layer structure composed of a SiO$_2$ layer and a SiN$_x$ layer, the Vth after the BTS test was not changed in comparison to the Vth before the BTS test, as shown in FIG. 17(b). This is because the SiN$_x$ layer that is an upper layer protected the entire gate insulating film from damages caused by the O$_2$ plasma. In the present experiment, the SiN$_x$ layer had a thickness of 40 nm, but even if the thickness was 10 nm or 20 nm (the EOT of the gate insulating film was about 70 nm), the same effects could be obtained.

The above results show that SiN$_x$ has an O$_2$ plasma resistance higher than that of SiO$_2$.

The present application claims priority under the Paris Convention and the domestic law in the country to be entered into national phase on Patent Application No. 2006-005402 filed in Japan on Jan. 12, 2006, the entire contents of which are hereby incorporated by reference.

The terms "or more" and "or less" mean that the described value is included. That is, the term "or more" means that the described value and values higher than the described value are included.

BRIEF DESCRIPTION OF DRAWINGS

FIG. 1 is a cross-sectional view schematically showing on one configuration of the first semiconductor device according to the present invention.

FIGS. 2(a) and 2(b) are cross-sectional views schematically showing one configuration of the second semiconductor device according to the present invention.

FIGS. 3(a) and 3(b) are cross-sectional views schematically showing one configuration of the third semiconductor device according to the present invention.

FIGS. 4(a) and 4(b) are cross-sectional views schematically showing one configuration of the fourth semiconductor device according to the present invention.

FIG. 5 is a cross-sectional view schematically showing a configuration of the active matrix substrate according to Embodiment 1 of the present invention.

FIGS. 6-1(a) to 6-1(f) are cross-sectional views schematically showing the first half of the production steps of the active matrix substrate according to Embodiment 1 of the present invention.

FIGS. 6-2(a) to 6-2(g) are cross-sectional views schematically showing the last half of the production steps of the active matrix substrate according to Embodiment 1 of the present invention.

FIGS. 14-1(a) to 14-1(h) are cross-sectional views schematically showing the first half of the production steps of the active matrix substrate according to Embodiment 5 of the present invention.

FIGS. 14-2(a) to 14-2(c) are cross-sectional views schematically showing the last half of the production steps of the active matrix substrate according to Embodiment 5 of the present invention.

FIG. 16(a) is a diagram showing a change between threshold voltage (Vth) characteristics before the BTS test and threshold voltage (Vth) characteristics after the BTS test of the TFT including a $SiO_2$ layer. FIG. 16(b) is a diagram showing a change between threshold voltage (Vth) characteristics before the BTS test and threshold voltage (Vth) characteristics after the BTS test of the TFT subjected to the $O_2$ plasma treatment. In FIGS. 16(a) and 16(b), the solid line shows Vth characteristics before the BTS test, and the broken line shows Vth characteristics after the BTS test.

FIG. 17(a) is a diagram showing a change between threshold voltage (Vth) characteristics before the BTS test and threshold voltage (Vth) characteristics after the BTS test of the TFT having a two-layer structure composed of a $SiO_2$ layer (lower layer) and a $SiN_x$ layer (upper layer). FIG. 17(b) is a diagram showing a change between threshold voltage (Vth) characteristics before the BTS test and threshold voltage (Vth) characteristics after the BTS test of the TFT subjected to the $O_2$ plasma treatment. In FIGS. 17(a) and 17(b), the solid line shows Vth characteristics before the BTS test, and the broken line shows Vth characteristics after the BTS test.

EXPLANATION OF NUMERALS AND SYMBOLS

Figures 2, 6:
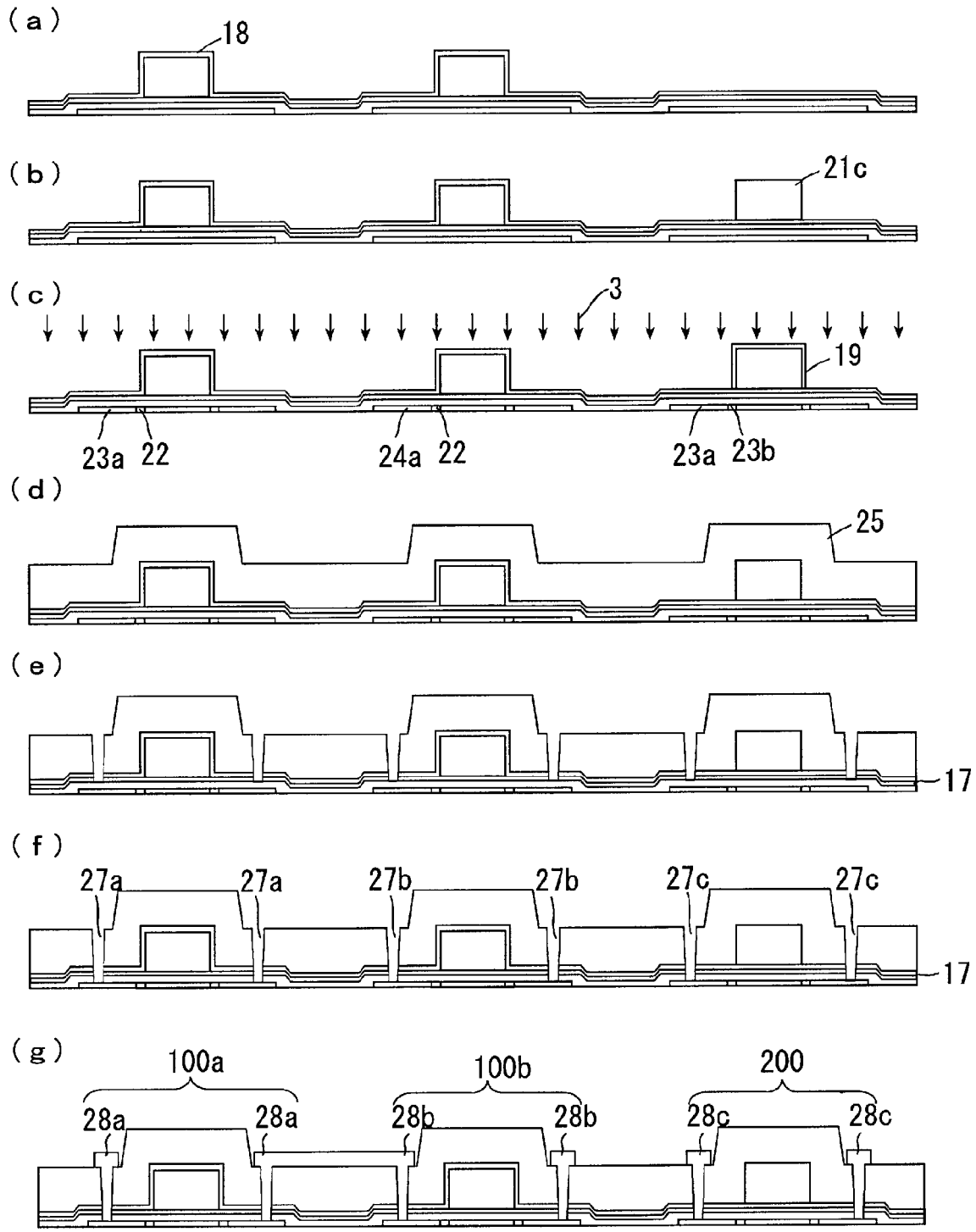
Figure 7:
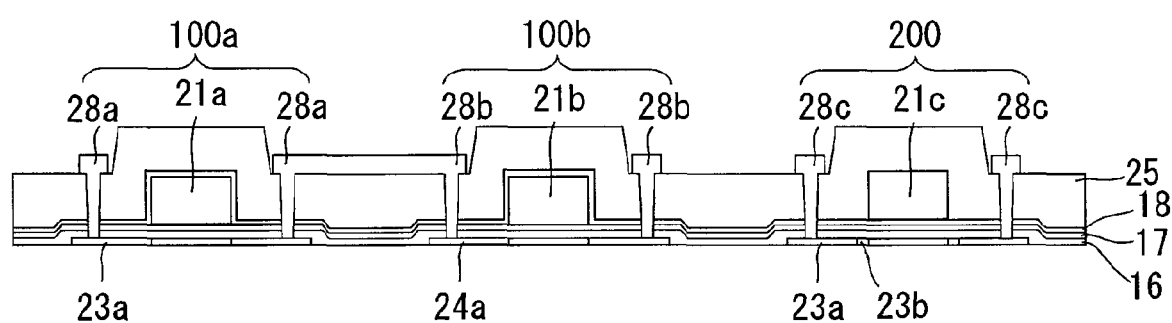
FIG. 7 is a cross-sectional view schematically showing a configuration of the active matrix substrate according to Embodiment 2 of the present invention.
Figure 8:
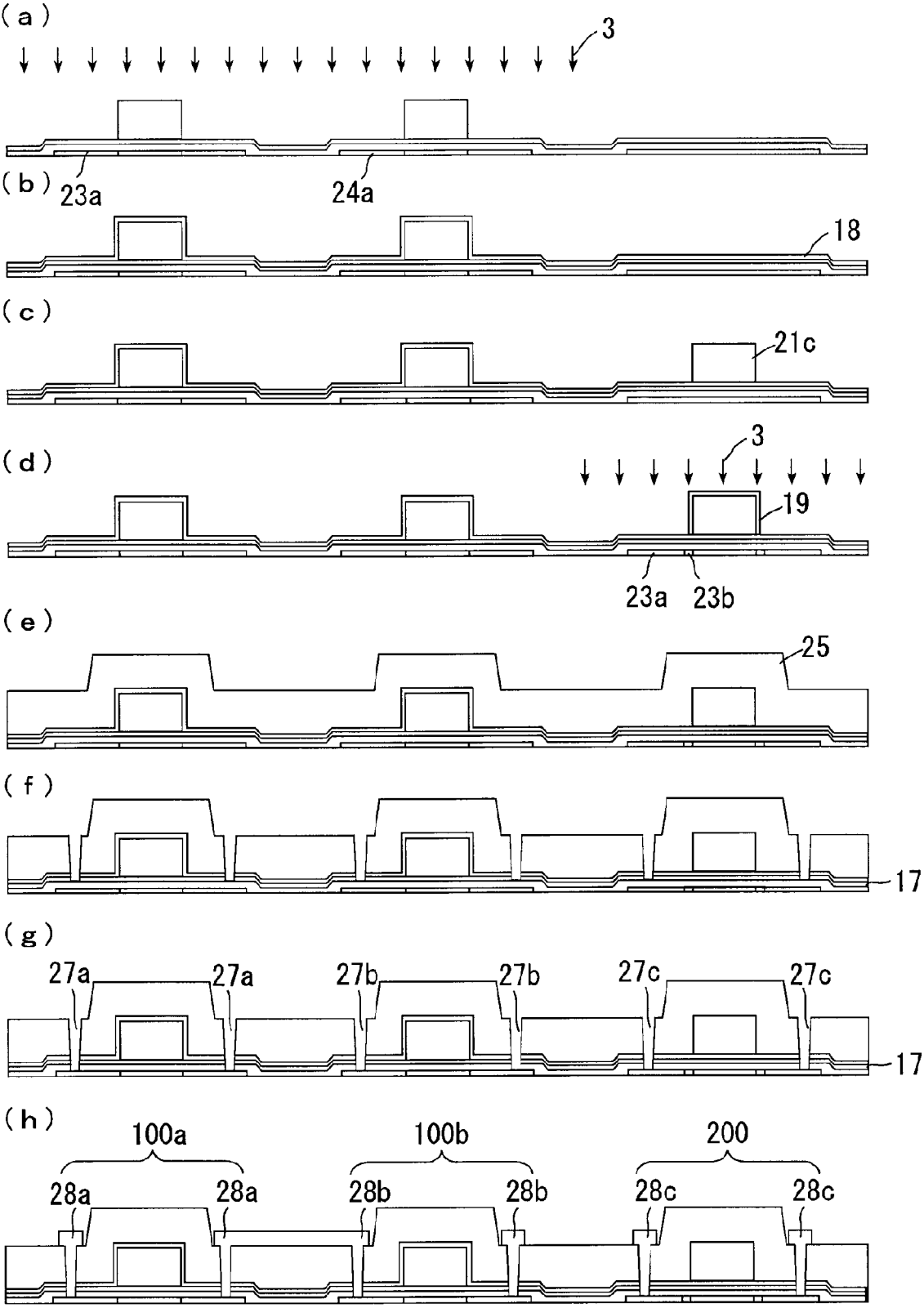
FIGS. 8(a) to 8(h) are cross-sectional views schematically showing production steps of the active matrix substrate according to Embodiment 2 of the present invention.
Figure 9:
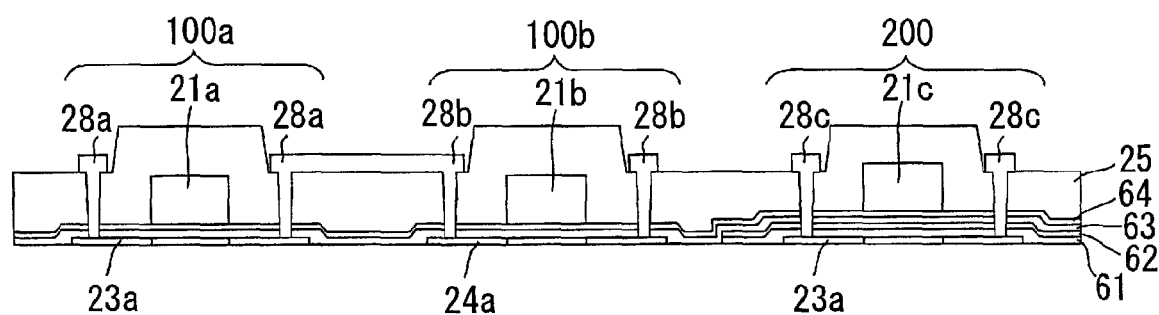
FIG. 9 is a cross-sectional view schematically showing a configuration of the active matrix substrate according to Embodiment 3 of the present invention.
Figure 10:
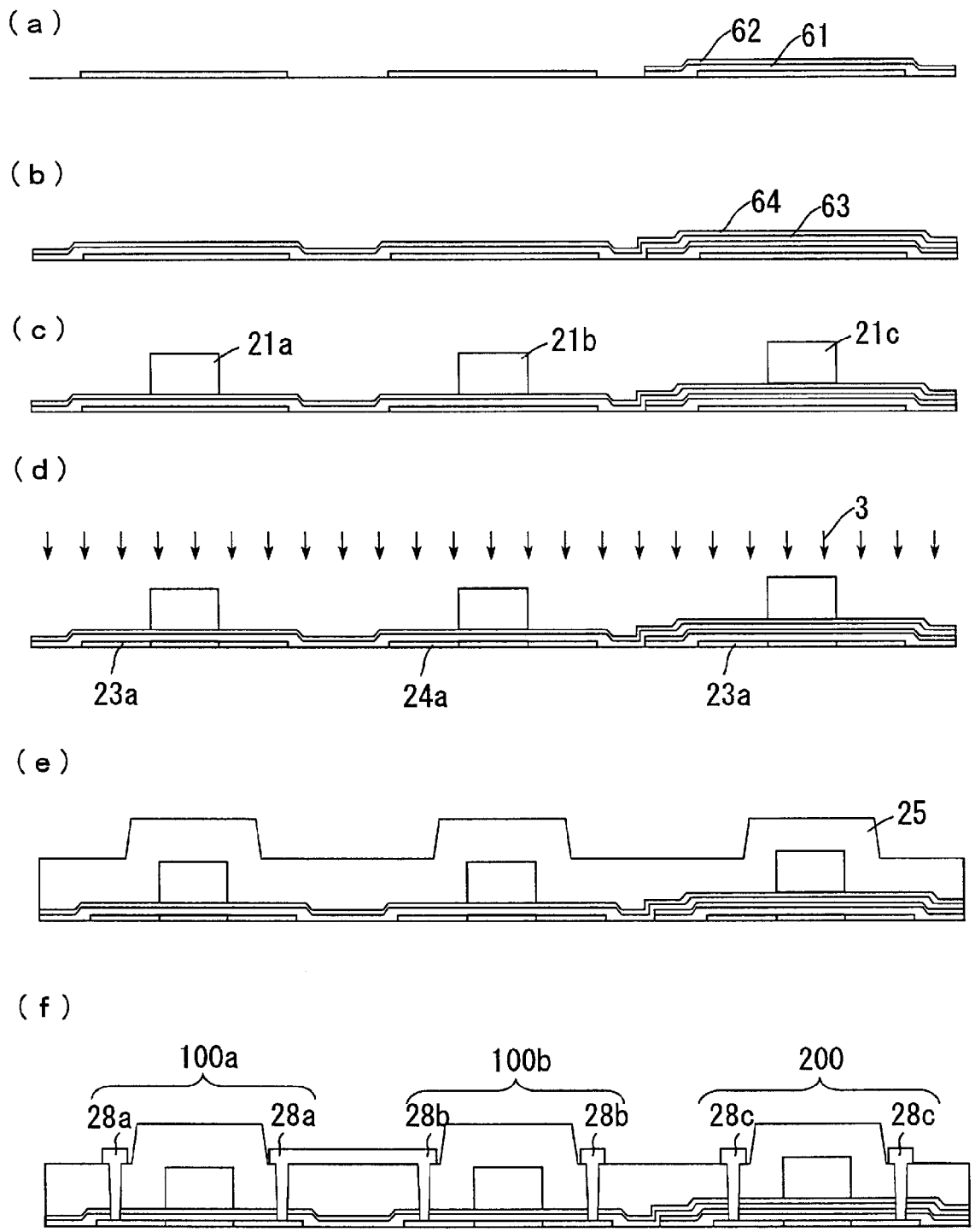
FIGS. 10(a) to 10(f) are cross-sectional views schematically showing production steps of the active matrix substrate according to Embodiment 3 of the present invention.
Figure 11:
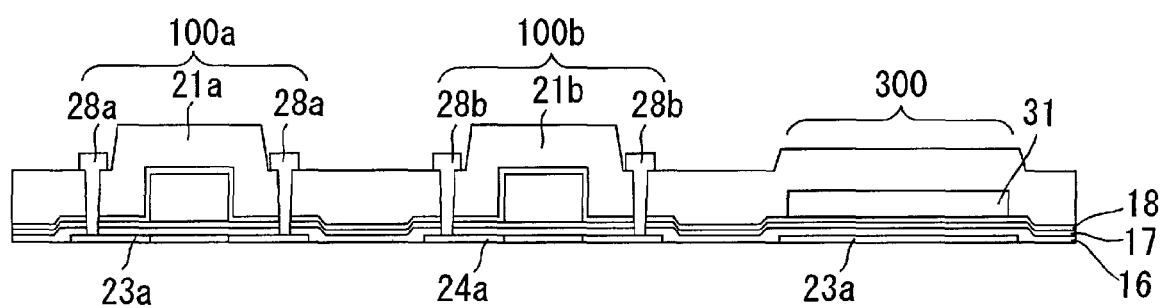
FIG. 11 is a cross-sectional view schematically showing a configuration of the active matrix substrate according to Embodiment 4 of the present invention.
Figure 12:
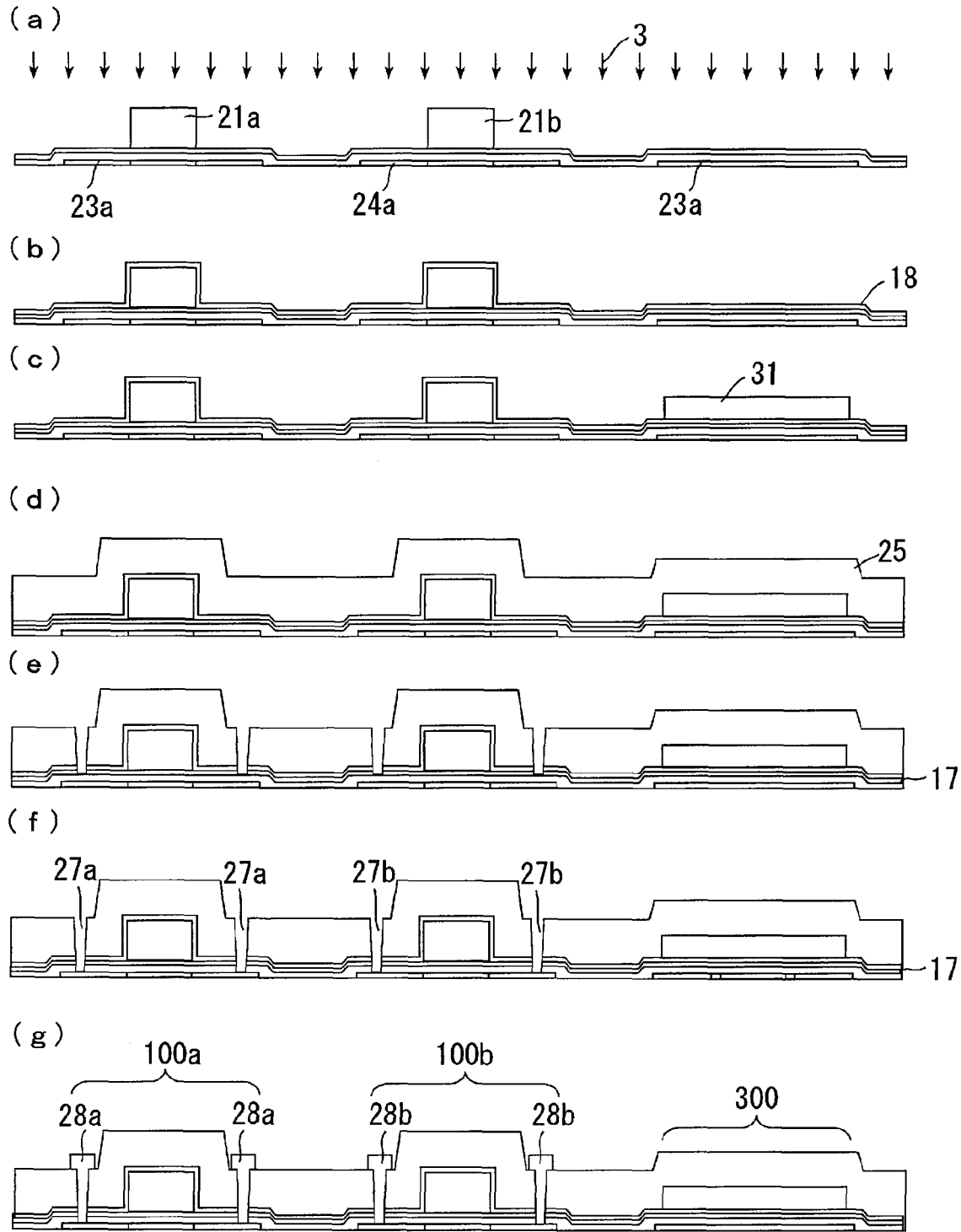
FIGS. 12(a) to 12(g) are cross-sectional views schematically showing production steps of the active matrix substrate according to Embodiment 4 of the present invention.
Figure 13:
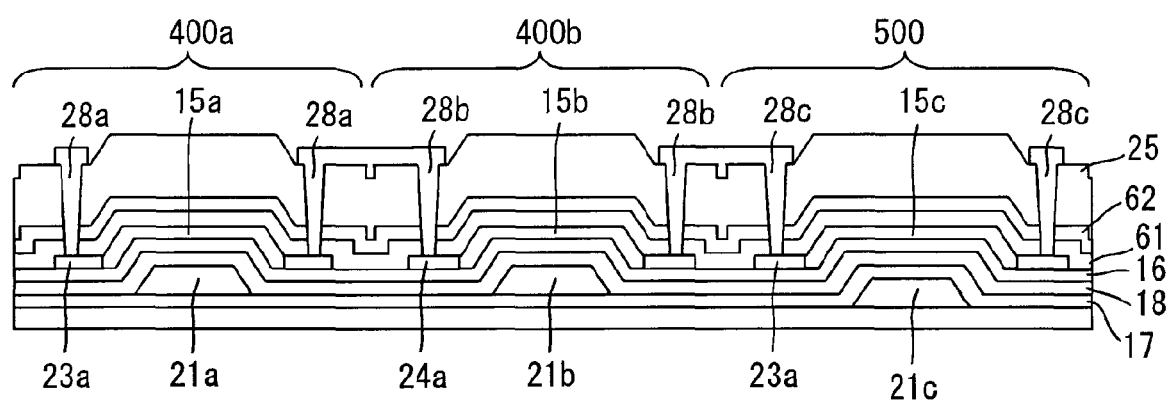
FIG. 13 is a cross-sectional view schematically showing a configuration of the active matrix substrate according to Embodiment 5 of the present invention.
Figures 1, 14:
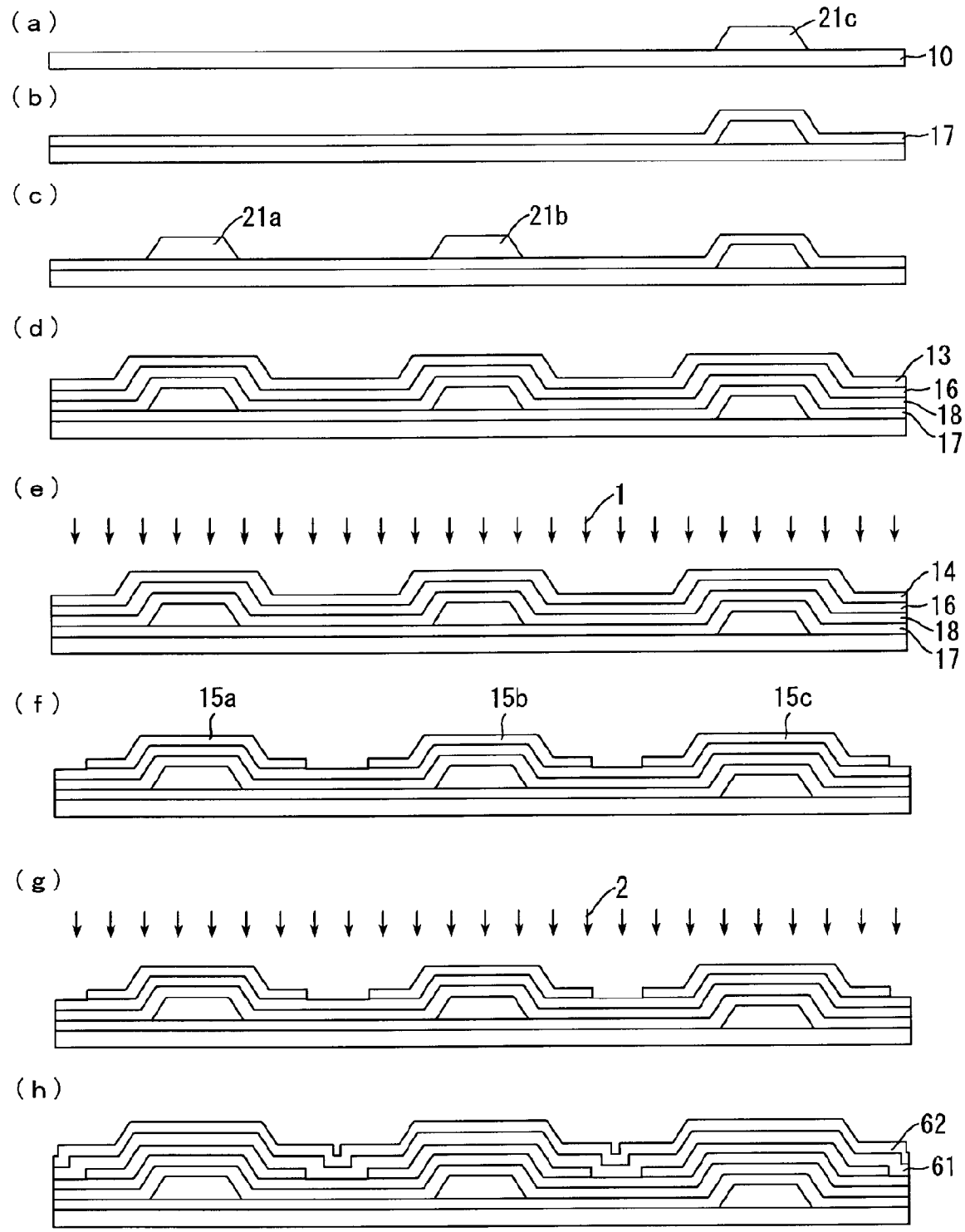
Figures 2, 14:
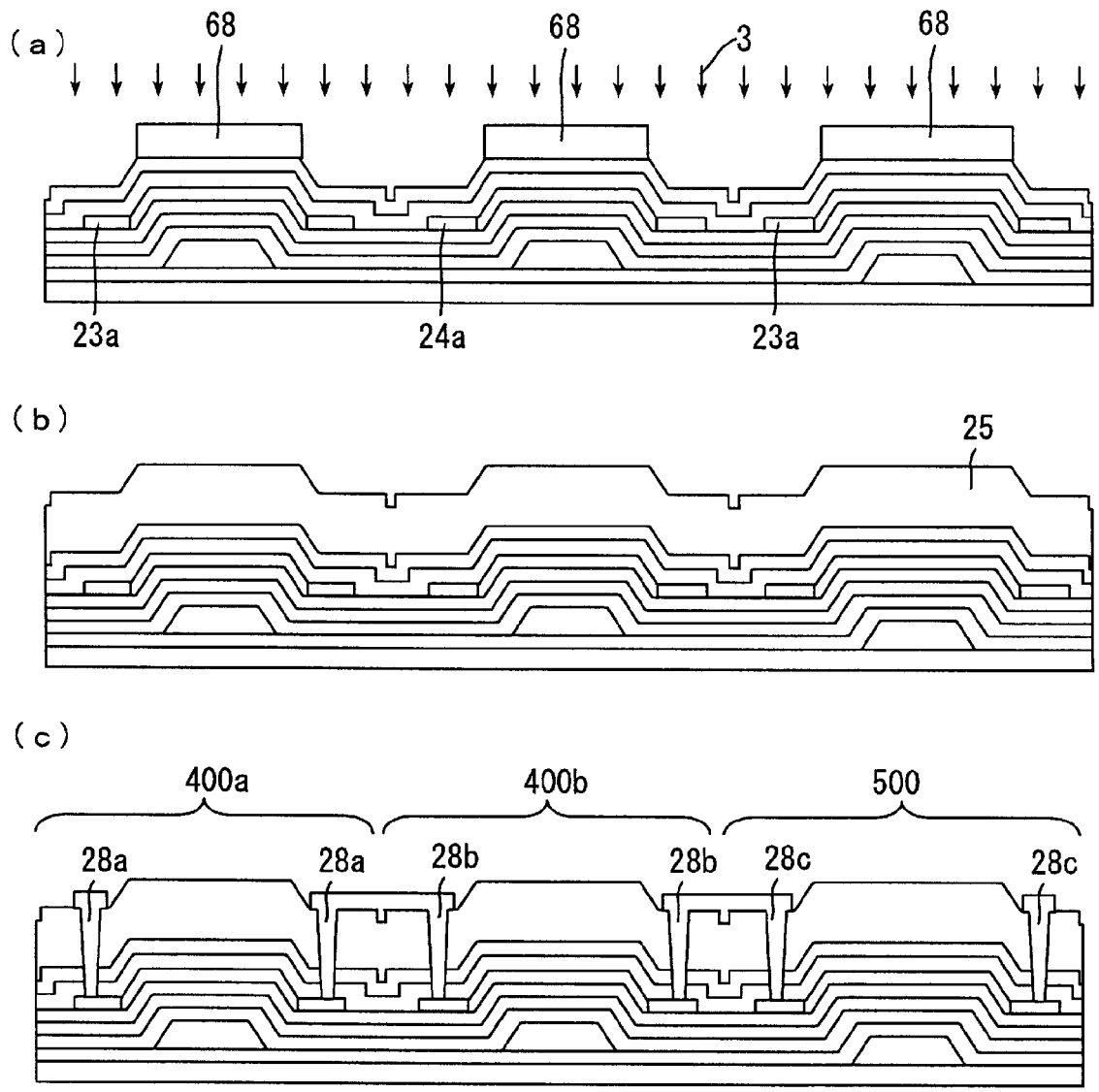
Figure 15:
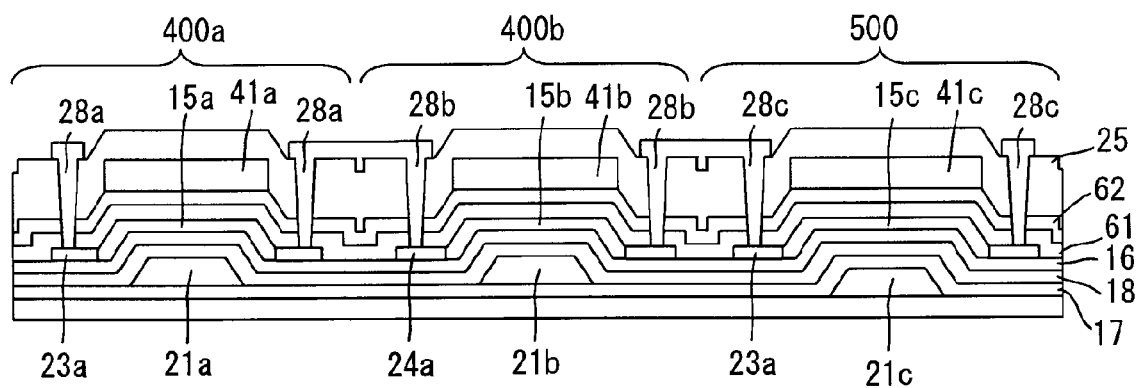
FIG. 15 is a cross-sectional view schematically showing a configuration of the active matrix substrate according to Embodiment 6 of the present invention.
Figure 18:
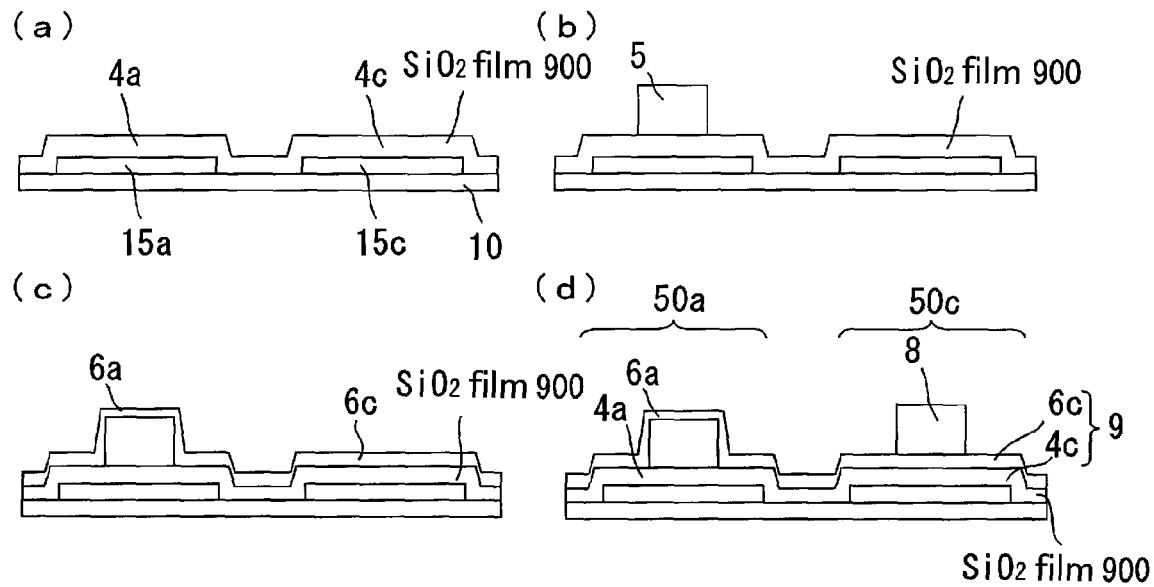
FIGS. 18(a) to (d) are cross-sectional views schematically showing a conventional production method of a semiconductor device.
Figure 19:
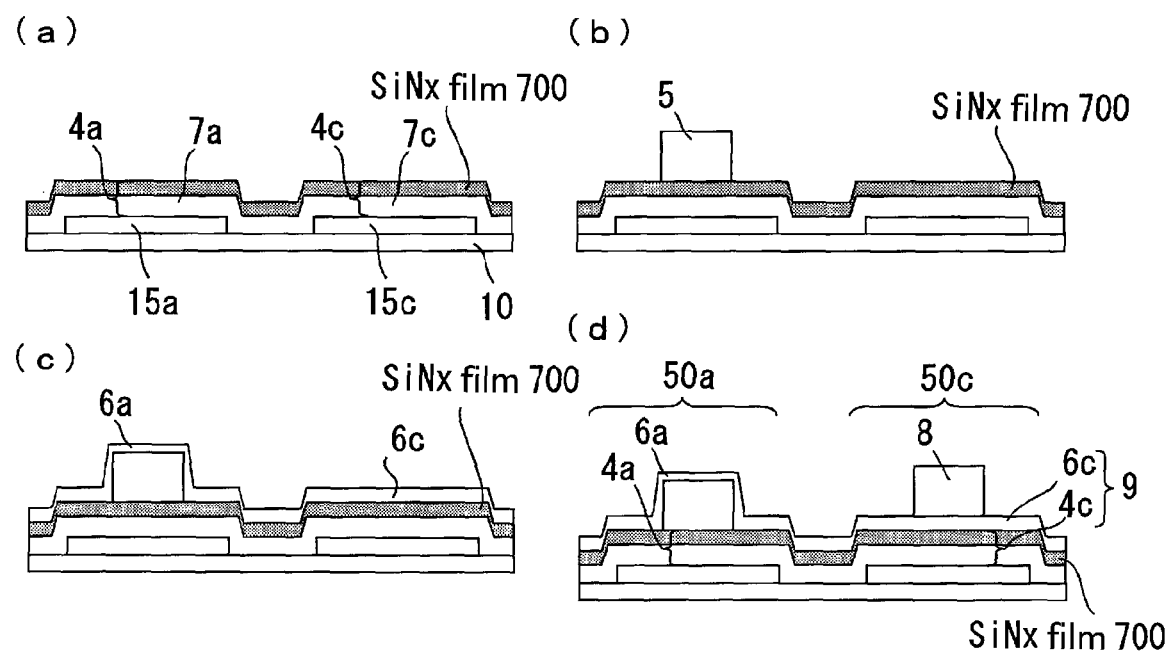
FIGS. 19(a) to 19(d) are cross-sectional views schematically showing one production method of a semiconductor device according to the present invention.

1: Laser light
2: Hydrogen ($H_2$) plasma or $H_2$ gas
3: Impurity
4a: The first gate insulating film (the first insulating film)
4c: Lower part of the second gate insulating film (the second insulating film)
5: The first gate electrode (the first conductive layer)
6a: The third insulating film (the lower, middle, or upper part of the third insulating film, or the entire third insulating film)
6c: Upper part of the second gate insulating film (the second insulating film)
7a: The lowest layer of the first gate insulating film (the first insulating film)
7c: The lowest layer in the lower part of the second gate insulating film (the second insulating film)
8: The second gate electrode (the second conductive layer)
8a: The first gate electrode (the first conductive layer)
8c: The second gate electrode (the second conductive layer)
9: The second gate insulating film (the second insulating film)
10: Glass substrate (substrate)
11: Hydrogen barrier and impurity diffusion-preventing film
12: Buffer film
13: Amorphous silicon (a-Si) film
14: Polysilicon (p-Si) film
15a, 15b: p-Si layer (the first semiconductor layer)
15c: p-Si layer (the second semiconductor layer)
16, 61, 63: Silicon oxide ($SiO_2$) film
17, 18, 62, 64: Silicon nitride ($SiN_x$) film
19, 68: Photoresist layer
21a, 21b: Gate electrode (the first conductive layer)
21c: Gate electrode (the second conductive layer)
22: Offset region
23a: N-type high-concentration impurity region
23b: N-type low-concentration impurity region (LDD region)
24a: P-type high-concentration impurity region
25: Interlayer insulating film
27a to 27c: Contact hole
28a to 28c: Source electrode
31: Storage capacitor wiring (the second conductive layer)
35: Metal film
41a to 41c: Upper gate electrode
50a: The first TFT (the first circuit element)
50c: The second TFT (the second circuit element)
70a: The first gate insulating film (the first insulating film)
70b: The third insulating film (the lower, middle, or upper part of the third insulating film, or the entire third insulating film)
70c: The second gate insulating film (the second insulating film)
71: Lower part of the second gate insulating film (the second insulating film)
72: Upper part of the second gate insulating film (the second insulating film)
100a and 400a: N-channel driving circuit TFT (the first circuit element)
100b, 400b: P-channel driving circuit TFT (the first circuit element)
200, 500: Pixel switching TFT (the second circuit element)
300: Storage capacitor element (the second circuit element)
700: $SiN_x$ film
900: $SiO_2$ film

The invention claimed is:

1. A semiconductor device comprising a first circuit element and a second circuit element on a substrate, the first circuit element having a structure in which a first semiconductor layer, a first insulating film, a first conductive layer, and a third insulating film are stacked in this order, the second circuit element having a structure in which a second semiconductor layer, a second insulating film having a thickness larger than a thickness of the first insulating film, and a second conductive layer are stacked in this order, wherein the first insulating film has a multilayer structure including a silicon nitride layer as the uppermost layer, the second insulating film has a lower part and an upper part, the lower part includes the multilayer structure of the first insulating film, and the upper part includes a structure of the third insulating film formed on the first conductive layer.

2. The semiconductor device according to claim 1, wherein the upper part of the second insulating film includes a silicon nitride layer as the lowest layer.

3. The semiconductor device according to claim 1, wherein the upper part of the second insulating film includes a silicon oxide layer as the lowest layer.

4. The semiconductor device according to claim 1, wherein the first insulating film and the second insulating film include a silicon oxide layer as the lowest layer.

5. The semiconductor device according to claim 1, wherein the first insulating film and the lower part of the second insulating film have a structure in which a silicon oxide layer and a silicon nitride layer are stacked in this order, and the upper part of the second insulating film is a silicon nitride layer.

6. The semiconductor device according to claim 1, wherein the first insulating film and the lower part of the second insulating film have a structure in which a silicon oxide layer and a silicon nitride layer are stacked in this order, and the upper part of the second insulating film is a silicon oxide layer.

7. The semiconductor device according to claim 1, wherein the first circuit element and the second circuit element are thin film transistors.

8. The semiconductor device according to claim 7, wherein the first circuit element is a thin film transistor in a driving circuit part, and the second circuit element is a thin film transistor in a pixel circuit part.

9. The semiconductor device according to claim 1, wherein the first circuit element or the second circuit element has a contact hole penetrating the silicon nitride layer.

10. The semiconductor device according to claim 1, wherein the first circuit element is a thin film transistor, and the second circuit element is a storage capacitor element.

11. The semiconductor device according to claim 10, wherein the first circuit element is a thin film transistor in a driving circuit part, and the second circuit element is a storage capacitor element in a pixel circuit part.

12. A display device comprising the semiconductor device of claim 1.

13. A semiconductor device comprising a first circuit element and a second circuit element on a substrate, the first circuit element having a structure in which a first semiconductor layer, a first insulating film, and a first conductive layer are stacked in this order, wherein the first circuit element includes a third insulating film on the first semiconductor layer, and the second circuit element having a structure in which a second semiconductor layer, a second insulating film having a thickness larger than a thickness of the first insulating film, and a second conductive layer are stacked in this order, wherein the second insulating film has a lower part and an upper part, the lower part includes a silicon nitride layer as the uppermost layer, and the upper part includes a structure of the first insulating film.

14. The semiconductor device according to claim 13, wherein the first circuit element includes a third insulating film below the first semiconductor layer, and the lower part of the second insulating film has a structure of the third insulating film formed below the first semiconductor layer.

15. The semiconductor device according to claim 13, wherein the first insulating film and the upper part of the second insulating film include a silicon nitride layer as the lowest layer.

16. The semiconductor device according to claim 13, wherein the first insulating film and the upper part of the second insulating film include a silicon oxide layer as the lowest layer.

17. The semiconductor device according to claim 13, wherein the first insulating film and the second insulating film include a silicon oxide layer as the lowest layer.

18. The semiconductor device according to claim 13, wherein the first insulating film, the lower part of the second insulating film, and the upper part of the second insulating film have a structure in which a silicon oxide layer and a silicon nitride layer are stacked in this order.

19. The semiconductor device according to claim 13, wherein the first circuit element and the second circuit element are thin film transistors.

20. The semiconductor device according to claim 19, wherein the first circuit element is a thin film transistor in a driving circuit part, and the second circuit element is a thin film transistor in a pixel circuit part.

21. The semiconductor device according to claim 13, wherein the first circuit element or the second circuit element has a contact hole penetrating the silicon nitride layer.

22. The semiconductor device according to claim 13, wherein the first circuit element is a thin film transistor, and the second circuit element is a storage capacitor element.

23. The semiconductor device according to claim 22, wherein the first circuit element is a thin film transistor in a driving circuit part, and the second circuit element is a storage capacitor element in a pixel circuit part.

24. A semiconductor device comprising a first circuit element and a second circuit element on a substrate, the first circuit element having a structure in which a first conductive layer, a first insulating film, and a first semiconductor layer are stacked in this order, wherein the first circuit element includes a third insulating film on the first semiconductor layer, the second circuit element having a structure in which a second conductive layer, a second insulating film having a thickness larger than a thickness of the first insulating film, and a second semiconductor layer are stacked in this order, wherein the first insulating film has a structure in which the lowest layer is a silicon nitride layer, the second insulating film has a lower part and an upper part, and the upper part has the structure of the first insulating film.

25. The semiconductor device according to claim 24,
wherein the first circuit element includes a third insulating film below the first conductive layer, and
the lower part of the second insulating film has a structure of the third insulating film formed below the first conductive layer.

26. The semiconductor device according to claim 24,
wherein the lower part of the second insulating film includes a silicon nitride layer as the uppermost layer.

27. The semiconductor device according to claim 24,
wherein the lower part of the second insulating film includes a silicon oxide layer as the uppermost layer.

28. The semiconductor device according to claim 24,
wherein the first insulating film and the second insulating film include a silicon oxide layer as the uppermost layer.

29. The semiconductor device according to claim 24,
wherein the first insulating film and the upper part of the second insulating film have a structure in which a silicon nitride layer and a silicon oxide layer are stacked in this order, and
the lower part of the second insulating film is a silicon nitride layer.

30. The semiconductor device according to claim 24,
wherein the first insulating film and the upper part of the second insulating film have a structure in which a silicon nitride layer and a silicon oxide layer are stacked in this order, and
the lower part of the second insulating film is a silicon oxide layer.

31. The semiconductor device according to claim 24,
wherein the first circuit element and the second circuit elements are thin film transistors.

32. The semiconductor device according to claim 31,
wherein the first circuit element is a thin film transistor in a driving circuit part and
the second circuit element is a thin film transistor in a pixel circuit part.

33. The semiconductor device according to claim 24,
wherein the first circuit element is a thin film transistor, and
the second circuit element is a storage capacitor element.

34. The semiconductor device according to claim 33,
wherein the first circuit element is a thin film transistor in a driving circuit part, and
the second circuit element is a storage capacitor element in a pixel circuit part.

35. A semiconductor device comprising a first circuit element and a second circuit element on a substrate,
the first circuit element having a structure in which a first conductive layer, a first insulating film, and a first semiconductor layer are stacked in this order, wherein the first circuit element includes a third insulating film on the first semiconductor layer,
the second circuit element having a structure in which a second conductive layer, a second insulating film having a thickness larger than a thickness of the first insulating film, and a second semiconductor layer are stacked in this order,
wherein the second insulating film includes a lower part and an upper part,
the lower part has a structure of the first insulating film, and
the upper part includes a silicon nitride layer as the lowest layer.

36. The semiconductor device according to claim 35,
wherein the first circuit element includes a third insulating film on the first semiconductor layer, and
the upper part of the second insulating film has a structure of the third insulating film formed on the first semiconductor layer.

37. The semiconductor device according to claim 35,
wherein the first insulating film and the lower part of the second insulating film include a silicon nitride layer as the uppermost layer.

38. The semiconductor device according to claim 35,
wherein the first insulating film and the lower part of the second insulating film include a silicon oxide layer as the uppermost layer.

39. The semiconductor device according to claim 35,
wherein the first insulating film and the second insulating film include a silicon oxide layer as the uppermost layer.

40. The semiconductor device according to claim 35,
wherein the first insulating film and the lower part of the second insulating film are silicon nitride layers, and
the upper part of the second insulating film has a structure in which a silicon nitride layer and a silicon oxide layer are stacked in this order.

41. The semiconductor device according to claim 35,
wherein the first insulating film and the lower part of the second insulating film are silicon oxide layers, and
the upper part of the second insulating film has a structure in which a silicon nitride layer and a silicon oxide layer are stacked in this order.

42. The semiconductor device according to claim 35,
wherein the first circuit element and the second circuit element are thin film transistors.

43. The semiconductor device according to claim 42,
wherein the first circuit element is a thin film transistor in a driving circuit part, and
the second circuit element is a thin film transistor in a pixel circuit part.

44. The semiconductor device according to claim 35,
wherein the first circuit element is a thin film transistor, and
the second circuit element is a storage capacitor element.

45. The semiconductor device according to claim 44,
wherein the first circuit element is a thin film transistor in a driving circuit part, and
the second circuit element is a storage capacitor element in a pixel circuit part.

* * * * *